United States Patent
Nakai et al.

(10) Patent No.: US 9,246,102 B2
(45) Date of Patent: Jan. 26, 2016

(54) ORGANIC SEMICONDUCTOR POLYMER, COMPOSITION FOR ORGANIC SEMICONDUCTOR MATERIAL, AND PHOTOVOLTAIC CELL

(71) Applicant: FUJIFILM Corporation, Minato-ku, Tokyo (JP)

(72) Inventors: Yoshihiro Nakai, Ashigarakami-gun (JP); Hiroki Sugiura, Ashigarakami-gun (JP); Kiyoshi Takeuchi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 79 days.

(21) Appl. No.: 14/034,641

(22) Filed: Sep. 24, 2013

(65) Prior Publication Data

US 2014/0021456 A1 Jan. 23, 2014

Related U.S. Application Data

(63) Continuation of application No. PCT/JP2012/055107, filed on Feb. 29, 2012.

(30) Foreign Application Priority Data

Mar. 31, 2011 (JP) ................. 2011-080813

(51) Int. Cl.
| | |
|---|---|
| *H01L 31/00* | (2006.01) |
| *H01L 51/00* | (2006.01) |
| *C08G 61/12* | (2006.01) |
| *H01L 51/42* | (2006.01) |

(52) U.S. Cl.
CPC .......... *H01L 51/0043* (2013.01); *C08G 61/123* (2013.01); *C08G 61/126* (2013.01); *H01L 51/0036* (2013.01); *C08G 2261/124* (2013.01); *C08G 2261/145* (2013.01); *C08G 2261/1452* (2013.01); *C08G 2261/3241* (2013.01); *C08G 2261/3243* (2013.01); *C08G 2261/3246* (2013.01); *C08G 2261/414* (2013.01); *C08G 2261/91* (2013.01); *H01L 51/0037* (2013.01); *H01L 51/4253* (2013.01); *Y02E 10/549* (2013.01)

(58) Field of Classification Search
CPC ...................... C08G 2261/12; C08G 2261/124; C08G 2261/145; C08G 2261/1452; C08G 2261/3241; C08G 2261/3243; C08G 2261/3246; C08G 2261/91; C08G 61/123; C08G 61/126; H01L 51/0036; H01L 51/0043
See application file for complete search history.

(56) References Cited

U.S. PATENT DOCUMENTS

| | | | |
|---|---|---|---|
| 7,759,428 B1 * | 7/2010 | Wang et al. | 525/328.5 |
| 2004/0187911 A1 * | 9/2004 | Gaudiana et al. | 136/252 |
| 2006/0180199 A1 * | 8/2006 | Lenhard et al. | 136/263 |
| 2007/0131270 A1 | 6/2007 | Gaudiana et al. | |
| 2007/0289626 A1 * | 12/2007 | Brabec et al. | 136/263 |
| 2008/0200634 A1 * | 8/2008 | Duffy et al. | 528/10 |
| 2011/0017983 A1 * | 1/2011 | Mizuki et al. | 257/40 |

FOREIGN PATENT DOCUMENTS

| | | |
|---|---|---|
| JP | 2004-67862 A | 3/2004 |
| JP | 2008-202053 A | 9/2008 |
| JP | 2009-501240 A | 1/2009 |
| JP | 2009-533878 A | 9/2009 |
| JP | 2011-184635 A | 9/2011 |
| WO | 2011/111683 A1 | 9/2011 |

OTHER PUBLICATIONS

In Tae Kim et al., "A New Low Bandgap Conducting Polymer", Polymer Preprints 2003, pp. 1163-1164, vol. 44, No. 1.
Nicolas Allard et al., "Synthesis and Characterization of New Poly(thieno[3,4-d]thiazole) Derivatives for Photovoltaic Applications", Macromolecules 2011, pp. 7184-7187, vol. 44.
Rycel Uy et al., "Improved Synthesis of Thienothiazole and Its Utility in Developing Polymers for Photovoltaics", Macromolecules 2011, pp. 9146-9154, vol. 44.
International Search Report for PCT/JP2012/055107 dated Jun. 12, 2012.

* cited by examiner

*Primary Examiner* — Eli Mekhlin
(74) *Attorney, Agent, or Firm* — Sughrue Mion, PLLC

(57) ABSTRACT

An organic semiconductor polymer comprising a structural unit represented by the following Formula (I), a composition for organic semiconductor material, a photovoltaic cell and a polymer.

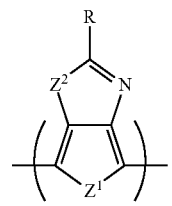

Formula (I)

wherein $Z^1$ and $Z^2$ each independently represent S, O, Se or Te; R represents $-SO_pX$, $-CN$, $-NO_2$, $-P(=O)(OR^{1'})(OR^2)$ or $-C(R^{1'})=C(CN)_2$; X represents a hydrogen atom, an alkyl group, a cycloalkyl group, an aryl group, an aromatic heterocyclic group or $-NR^3(R^4)$; $R^1$, $R^2$, $R^{1'}$, $R^3$ and $R^4$ each independently represent a hydrogen atom, an alkyl group, a cycloalkyl group, an aryl group or an aromatic heterocyclic group; $R^3$ and $R^4$ may bond with each other to form a ring; and p represents 1 or 2.

16 Claims, No Drawings

ORGANIC SEMICONDUCTOR POLYMER, COMPOSITION FOR ORGANIC SEMICONDUCTOR MATERIAL, AND PHOTOVOLTAIC CELL

TECHNICAL FIELD

The present invention relates to an organic semiconductor polymer, a composition for organic semiconductor material and a photovoltaic cell.

BACKGROUND ART

Organic semiconductor polymers have been a subject of active research in recent years in the field of organic electronics, and the polymers are used in organic electroluminescent elements that emit light when electricity is passed, organic photoelectric conversion elements that generate power when irradiated with light, organic thin film transistor elements that control the amount of current or the amount of voltage, and the like. In such an element, similarly to an inorganic semiconductor material, use is made of an organic semiconductor material obtained by combining a p-type conductive semiconductor material, which is an electron donor material, and an n-type conductive semiconductor material, which is an electron acceptor material.

In recent years, since fossil energy of petroleum and the like emit carbon dioxide to the atmosphere, for the purpose of global environment preservation with the suppression of global warming, there is an increasing demand of solar cells. Known examples of organic solar cells that use organic photoelectric conversion elements include a wet type dye-sensitized solar cell (Gräetzel cell) and a total solid type organic thin film solar cell. Since the latter does not use an electrolyte solution, there is no need to take evaporation of this electrolyte solution or liquid leakage into consideration, the solar cell can be made flexible, and the structure of the solar cell or production thereof is more convenient than that of the former.

However, the photoelectric conversion efficiency of organic thin film solar cells is still insufficient. The photoelectric conversion efficiency is calculated by short circuit current (Jsc)×open circuit voltage (Voc)×fill factor (FF); according to which, in order to increase this efficiency, an increase in the open circuit voltage is also needed along with an increase in the short circuit current. The short circuit current is increased when an organic semiconductor material having high solubility and carrier mobility (for example, a compound having a fluorene structure or a silafluorene structure) is used. The open circuit voltage, which is said to be connected with the difference between the HOMO energy level of the p-type conductive semiconductor material and the LUMO energy level of the n-type conductive semiconductor material, is raised when this difference is increased. Furthermore, in the case of an organic solar cell, in order to increase the efficiency, it is efficient to absorb more light of a region of longer wavelengths (650 nm to 800 nm) than the wavelengths of sunlight. Therefore, band gap narrowing is desirable. It is expected that the enhancement of luminescence efficiency, that is, enhancement of the power efficiency of organic electroluminescent lighting for an organic electroluminescent element.

On the other hand, studies on organic semiconductor polymers as p-type conductive semiconductor materials, which are electron donor materials, are in active progress. For example, Patent Literature 1 suggests a polymer having a thieno[3,4-d]thiazole-6,4-diyl structure having a hydrogen atom, a halogen atom, an aryl group, a heteroaryl group or an alkyl group having a particular substituent at the 2-position; and Patent Literature 2 suggests a polymer having a thieno[3,4-d]thiazole-6,4-diyl structure having a particular alkyl group at the 2-position. However, in both cases, the conversion efficiency of the solar cell using the above-mentioned polymers is not necessarily sufficient, and these polymers are not satisfactory in terms of durability, and particularly in terms of durability in the presence of oxygen.

Furthermore, in the case of producing a large-sized solar cell by a coating process, in the case of producing a large-sized solar cell by a coating process, it is required that the photoelectric conversion layer (active layer) have less unevenness for film thickness or fewer pinholes, and uniform battery performance be obtained even at different sites on the photoelectric conversion layer.

CITATION LIST

Patent Literatures

Patent Literature 1: JP-T-2009-501240 ("JP-T" means searched and published International patent publication)
Patent Literature 2: JP-A-2008-202053 ("JP-A" means unexamined published Japanese patent application)

SUMMARY OF THE INVENTION

Technical Problem

An object of the present invention is to provide an organic semiconductor polymer which has excellent photoelectric conversion efficiency and is excellent in durability, particularly in durability in the presence of oxygen, which has less unevenness for film thickness and fewer pinholes in the photoelectric conversion layer, and in which uniform battery performance is obtained even at different sites of the photoelectric conversion layer. Particularly, it is an object of the present invention to achieve a good balance between band gap narrowing conducted to enhance the photoelectric conversion efficiency and an enhancement of durability, and then to provide an organic semiconductor polymer which has less unevenness for film thickness or fewer pinholes in the photoelectric conversion layer, and enable attainment of uniform battery performance even at different sites of the photoelectric conversion layer. Furthermore, another object of the present invention is to provide a composition for organic semiconductor materials containing such an organic semiconductor polymer, and a photovoltaic cell (particularly, an organic thin film solar cell) having the polymer or the composition. Moreover, still another object of the present invention is to provide a polymer which is useful for organic electronic devices such as an organic electroluminescent element and an organic thin film transistor element.

Solution to Problem

The inventors of the present invention conducted thorough investigations in order to achieve the problems described above, and as a result, they paid attention to the deep HOMO energy level of organic semiconductor polymers for an enhancement in the efficiency of organic semiconductor polymers, particularly an enhancement in durability, and investigated various compounds having such a polymer structure. Thereby, the inventors found that an organic semiconductor polymer having a particular structure can achieve a balance between wavelength lengthening of the absorption wavelength in the band gap narrowing of a photovoltaic cell, and an enhancement of durability. Particularly, for a good balance between the photoelectric conversion efficiency and durability, the number of rings in a condensed ring, the mode of condensation, and the kind of the condensed ring are important, and when the organic semiconductor polymer is allowed to adopt a thieno[3,4-d]thiazole structure and to have an electron-withdrawing substituent substituted at the 2-position, the polymer is enabled to have a deep HOMO energy level. Furthermore, in regard to the reduction of unevenness for film thickness or pinholes in the photoelectric conversion layer, when the organic semiconductor polymer is allowed to have a highly polar thieno[3,4-d]thiazole skeletal structure and to have an electron-withdrawing polar group at the 2-position, the polarity of the polymer increases, and wettability of the polymer to a highly polar hole transport layer of PEDOT:PSS or the like, which lays primarily as a lower layer, is enhanced. The inventors found that cissing or fallouts (pinholes) of a photoelectric active layer coating liquid containing this polymer, and unevenness for film thickness are thereby reduced.

The present invention has been achieved based on those findings.

All of the problems of the present invention can be solved by the following means.

<1> An organic semiconductor polymer having a structural unit represented by the following Formula (I):

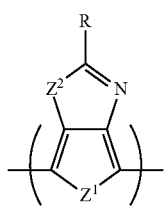

Formula (I)

wherein $Z^1$ and $Z^2$ each independently represent S, O, Se or Te; R represents —$SO_pX$, —CN, —$NO_2$, —P(=O)($OR^1$)($OR^2$) or —C($R^{1\prime}$)=C($CN$)$_2$; X represents a hydrogen atom, an alkyl group, a cycloalkyl group, an aryl group, an aromatic heterocyclic group or —$NR^3(R^4)$; $R^1$, $R^2$, $R^{1\prime}$, $R^3$ and $R^4$ each independently represent a hydrogen atom, an alkyl group, a cycloalkyl group, an aryl group or an aromatic heterocyclic group; $R^3$ and $R^4$ may bond with each other to form a ring; and p represents 1 or 2.

<2> The organic semiconductor polymer described in the above item <1>, wherein the structural unit represented by Formula (I) is a structural unit represented by Formula (I-1):

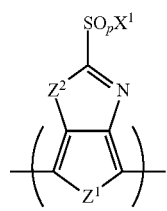

Formula (I-1)

wherein $Z^1$, $Z^2$ and p have the same meaning as $Z^1$, $Z^2$ and p in Formula (I), respectively; $X^1$ represents an alkyl group, a cycloalkyl group, an aryl group, an aromatic heterocyclic group or —$NR^3(R^4)$; $R^3$ and $R^4$ each independently represent a hydrogen atom, an alkyl group, a cycloalkyl group, an aryl group or an aromatic heterocyclic group; and $R^3$ and $R^4$ may bond with each other to form a ring.

<3> The organic semiconductor polymer described in the above item <2>, wherein p is 2 in Formula (I-1).

<4> The organic semiconductor polymer described in the above item <2> or <3>, wherein, in Formula (I-1), $X^1$ is an alkyl group, a cycloalkyl group, an aryl group or an aromatic heterocyclic group.

<5> The organic semiconductor polymer described in the above item <2>, wherein —$SO_pX^1$ in Formula (I-1) is —$SO_2NR^3(R^4)$ (herein $R^3$ and $R^4$ have the same meaning as those in Formula (I-1), respectively).

<6> The organic semiconductor polymer described in the above item <2> or <4>, wherein p is 1 in Formula (I-1).

<7> The organic semiconductor polymer described in any one of the above items <1> to <6>, wherein the organic semiconductor polymer is a copolymer.

<8> The organic semiconductor polymer described in any one of the above items <1> to <7>, wherein the organic semiconductor polymer is a copolymer which further includes a structural unit represented by the following Formula (II):

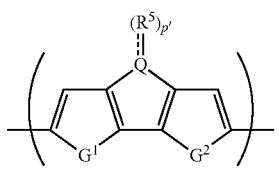

Formula (II)

wherein Q represents Si, S, O or N; $G^1$ and $G^2$ each independently represent S, O, Se or Te; $R^5$ represents a hydrogen atom, an alkyl group, a cycloalkyl group, an aryl group, an aromatic heterocyclic group or an oxygen atom; p' represents 0, 1 or 2; when p' is 2, two $R^5$'s may be the same or different from each other; herein, the bond between Q and $R^5$ is such that when Q is Si or N, the bond is a single bond, and when Q is S, the bond is a double bond. Furthermore, when Q is O, p' represents 0, and when Q is N, p' represents 1.

<9> A composition for organic semiconductor material, including the organic semiconductor polymer described in any one of the above items <1> to <8> and an n-type organic semiconductor molecule.

<10> The composition for organic semiconductor material described in the above item <9>, wherein the n-type organic semiconductor molecule is fullerene or a derivative thereof.

<11> The composition for organic semiconductor material described in the above item <10>, wherein the fullerene or a derivative thereof is a phenyl-$C_{61}$-butyric acid ester, a diphenyl-$C_{62}$-bis(butyric acid ester), a phenyl-$C_{71}$-butyric acid ester, a phenyl-$C_{85}$-butyric acid ester, or a thienyl-$C_{61}$-butyric acid ester.

<12> A photovoltaic cell including the organic semiconductor polymer or the composition for organic semiconductor material described in any one of the above items <1> to <11>.

<13> A photovoltaic cell including a layer containing the organic semiconductor polymer or the composition for organic semiconductor material described in any one of the above items <1> to <11>, between a first electrode and a second electrode.

<14> The photovoltaic cell described in the above item <13>, including a hole transport layer between the first electrode and the layer containing the organic semiconductor polymer or the composition for organic semiconductor material.

<15> The photovoltaic cell described in the above item <13> or <14>, including an electron transport layer between the second electrode and the layer containing the organic semiconductor polymer or the composition for organic semiconductor material.

<16> The photovoltaic cell described in any one of the above items <13> to <15>, wherein the first electrode is a transparent electrode.

<17> The photovoltaic cell described in any one of the above items <13> to <16>, wherein the second electrode is a metal electrode.

<18> A polymer having a structural unit represented by the following Formula (I):

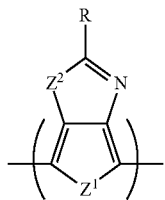

Formula (I)

wherein $Z^1$ and $Z^2$ each independently represent S, O, Se or Te; R represents —SO$_p$X, —CN, —NO$_2$, —P(=O)(OR$^1$)(OR$^2$) or —C(R$^{1'}$)=C(CN)$_2$; X represents a hydrogen atom, an alkyl group, a cycloalkyl group, an aryl group, an aromatic heterocyclic group or —NR$^3$(R$^4$); R$^1$, R$^2$, R$^{1'}$, R$^3$ and R$^4$ each independently represent a hydrogen atom, an alkyl group, a cycloalkyl group, an aryl group or an aromatic heterocyclic group; R$^3$ and R$^4$ may bond with each other to form a ring; and p represents 1 or 2.

<19> The polymer described in the above item <18>, wherein the structural unit represented by Formula (I) is a structural unit represented by Formula (I-1):

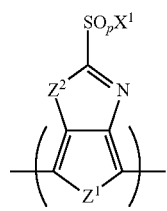

Formula (I-1)

wherein $Z^1$, $Z^2$ and p have the same meaning as $Z^1$, $Z^2$ and p in Formula (I), respectively; $X^1$ represents an alkyl group, a cycloalkyl group, an aryl group, an aromatic heterocyclic group or —NR$^3$(R$^4$); R$^3$ and R$^4$ each independently represent a hydrogen atom, an alkyl group, a cycloalkyl group, an aryl group or an aromatic heterocyclic group; and R$^3$ and R$^4$ may bond with each other to form a ring.

<20> The polymer described in the above item <19>, wherein p is 2 in Formula (I-1).

<21> The polymer described in the above item <18> or <19>, wherein the polymer is a copolymer which further includes a structural unit represented by the following Formula (II):

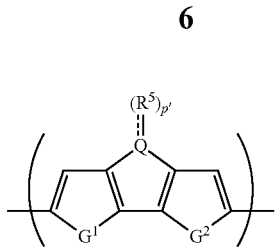

Formula (II)

wherein Q represents Si, S, O or N; $G^1$ and $G^2$ each independently represent S, O, Se or Te; $R^5$ represents a hydrogen atom, an alkyl group, a cycloalkyl group, an aryl group, an aromatic heterocyclic group or an oxygen atom; p' represents 0, 1 or 2; when p' is 2, two $R^5$'s may be the same or different from each other; herein, the bond between Q and $R^5$ is such that when Q is Si or N, the bond is a single bond, and when Q is S, the bond is a double bond. Furthermore, when Q is O, p' represents 0, and when Q is N, p' represents 1.

Advantageous Effects of Invention

According to the present invention, an organic semiconductor polymer which has excellent photoelectric conversion efficiency and is excellent in durability, particularly in durability in the presence of oxygen, which has less unevenness for film thickness or fewer pinholes in the photoelectric conversion layer with less unevenness for film thickness or fewer pinholes in the photoelectric conversion layer, and in which uniform battery performance is obtained even at different sites of the photoelectric conversion layer; a composition for organic semiconductor material containing the organic semiconductor polymer; a photovoltaic cell (particularly, an organic thin film solar cell) including the polymer or the composition; and a polymer can be provided.

MODE FOR CARRYING OUT THE INVENTION

<Polymer Having Structure Unit Represented by Formula (I) of Invention>

First, the polymer having a structural unit represented by the following Formula (I) of the present invention will be described.

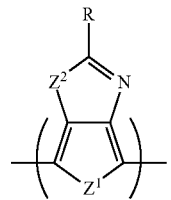

Formula (I)

In Formula (I), $Z^1$ and $Z^2$ each independently represent S, O, Se or Te; and R represents —SO$_p$X, —CN, —NO$_2$, —P(=O)(OR$^1$)(OR$^2$) or —C(R$^{1'}$)=C(CN)$_2$. Herein, X represents a hydrogen atom, an alkyl group, a cycloalkyl group, an aryl group, an aromatic heterocyclic group or —NR$^3$(R$^4$). R$^1$, R$^2$, R$^{1'}$, R$^3$ and R$^4$ each independently represent a hydrogen atom, an alkyl group, a cycloalkyl group, an aryl group or an aromatic heterocyclic group. R$^3$ and R$^4$ may bond with each other to form a ring. p represents 1 or 2.

$Z^1$ and $Z^2$ are preferably S, O or Se; more preferably S or O; and most preferably S.

R is preferably —SO$_p$X. X represents a hydrogen atom, an alkyl group, a cycloalkyl group, an aryl group, an aromatic heterocyclic group or —NR³(R⁴). X is preferably an alkyl group, a cycloalkyl group, an aryl group, an aromatic heterocyclic group or —NR³(R⁴); more preferably an alkyl group, a cycloalkyl group, an aryl group or an aromatic heterocyclic group; further preferably an alkyl group, a cycloalkyl group or an aryl group; particularly preferably an alkyl group or an aryl group; and most preferably an alkyl group.

The alkyl group for X is a substituted or unsubstituted, linear or branched alkyl group, and preferably an alkyl group having 1 to 30 carbon atoms. Examples thereof include methyl, ethyl, n-propyl, isopropyl, t-butyl, n-octyl, eicosyl, 2-chloroethyl, 2-cyanoethyl, and 2-ethylhexyl.

The cycloalkyl group for X is a substituted or unsubstituted cycloalkyl group, and preferably a cycloalkyl group having 3 to 30 carbon atoms. Examples thereof include cyclohexyl, cyclopentyl, and 4-n-dodecylcyclohexyl.

The aryl group for X is a substituted or unsubstituted aryl group, and preferably an aryl group having 6 to 30 carbon atoms. Examples thereof include phenyl, p-tolyl, naphthyl, m-chlorophenyl, and an o-hexadecanoylaminophenyl.

The aromatic heterocyclic group for X is a substituted or unsubstituted aromatic heterocyclic group, preferably having 0 to 30 carbon atoms, and preferably being a 5-membered ring or a 6-membered ring. These rings may be fused with an alicyclic ring, an aromatic ring, a heterocyclic ring and an aromatic heterocyclic ring. Examples of the heterocyclic ring for the aromatic heterocyclic group include a furan ring, a pyrrole ring, a pyridine ring, a thiophene ring, an imidazole ring, an oxazole ring, a thiazole ring, a pyrazole ring, an isoxazole ring, an isothiazole ring, a pyrimidine ring, a pyrazine ring, a pyridazine ring, an indole ring, an indazole ring, a purine ring, and a quinoline ring.

$R^3$ and $R^4$ in —NR³(R⁴) for X each independently represent a hydrogen atom, an alkyl group (a substituted or unsubstituted, linear or branched alkyl group, and preferably an alkyl group having 1 to 30 carbon atoms), a cycloalkyl group (a substituted or unsubstituted cycloalkyl group, and preferably a cycloalkyl group having 3 to 30 carbon atoms), an aryl group (a substituted or unsubstituted aryl group, and preferably an aryl group having 6 to 30 carbon atoms), or an aromatic heterocyclic group (a substituted or unsubstituted aromatic heterocyclic group, preferably having 0 to 30 carbon atoms and preferably being a 5-membered ring or a 6-membered ring, while these rings may be fused with an alicyclic ring, an aromatic ring, a heterocyclic ring or an aromatic heterocyclic ring). Examples of specific groups for $R^3$ and $R^4$ include the specific groups for the alkyl group, cycloalkyl group, aryl group and aromatic heterocyclic group that have been mentioned as X, and preferred ranges thereof are also the same.

When X is —NR³(R⁴), $R^3$ and $R^4$ each are preferably a hydrogen atom, an alkyl group, a cycloalkyl group or an aryl group; and more preferably a hydrogen atom, an alkyl group or an aryl group. Furthermore, it is preferable that any one of $R^3$ and $R^4$ be a hydrogen atom or an alkyl group, and in this case, the other is preferably an alkyl group, a cycloalkyl group or an aryl group, more preferably an alkyl group or an aryl group, and most preferably an alkyl group. Furthermore, it is more preferable that any one of $R^3$ and $R^4$ be an alkyl group, and in this case, the other is more preferably an alkyl group, a cycloalkyl group or an aryl group, even more preferably an alkyl group or an aryl group, and most preferably an alkyl group. Here, $R^3$ and $R^4$ may also be bonded to each other and form a ring. The ring formed when these are bonded is preferably a 5-membered or 6-membered nitrogen-containing heterocyclic ring, and examples thereof include a pyrrolidine ring, a piperidine ring, a piperazine ring, and a morpholine ring.

When X is —NR³(R⁴), p is preferably 2.

p is preferably 2. When p is 1, X is preferably a hydrogen atom, an alkyl group, a cycloalkyl group, an aryl group or an aromatic heterocyclic group; more preferably an alkyl group, a cycloalkyl group or an aryl group; further preferably an alkyl group or an aryl group; and most preferably an alkyl group. When p is 2, X is preferably an alkyl group, a cycloalkyl group, an aryl group, an aromatic heterocyclic group or —NR³(R⁴).

Further, the case where p is 1 is more preferable than the case where p is 2 and X is —NR³(R⁴).

When R is —P(=O)(OR¹)(OR²), examples of $R^1$ and $R^2$ include the specific groups for the alkyl group, cycloalkyl group, aryl group and aromatic heterocyclic group that have been mentioned as X, and preferred ranges thereof are also the same.

$R^1$ and $R^2$ are each preferably an alkyl group, a cycloalkyl group, an aryl group, or an aromatic heterocyclic group, more preferably an alkyl group, a cycloalkyl group, or an aryl group, and even more preferably an alkyl group or an aryl group.

Furthermore, it is preferable that $R^1$ and $R^2$ together represent groups selected from an alkyl group and an aryl group.

When R is —C(R¹')=C(CN)₂, examples of $R^{1'}$ include the specific groups for the alkyl group, cycloalkyl group, aryl group and aromatic heterocyclic group that have been mentioned as X, and a preferred range thereof is also the same.

$R^{1'}$ is preferably a hydrogen atom or an alkyl group; and most preferably a hydrogen atom.

The alkyl group, cycloalkyl group, aryl group and aromatic heterocyclic group for $R^1$, $R^2$, $R^{1'}$, $R^3$ and $R^4$ may be substituted with substituents as described above. Examples of the substituent include a halogen atom, an alkyl group, a cycloalkyl group, a bicycloalkyl group, an alkenyl group, a cycloalkenyl group, a bicycloalkenyl group, an alkynyl group, an aryl group, a heterocyclic group (preferably a 5- or 6-membered substituted or unsubstituted heterocyclic group, that is a monovalent group obtained by removing one hydrogen atom from an aromatic or non-aromatic heterocyclic compound), a cyano group, a hydroxyl group, a nitro group, a carboxyl group, an alkoxy group, an aryloxy group, a silyloxy group, a heterocyclic oxy group, an acyloxy group, a thioacyloxy group, a thioacylthio group, a carbamoyloxy group, an alkoxycarbonyloxy group, an aryloxycarbonyloxy group, an amino group (including an amino group, an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, an aryloxythiocarbonyl group, an alkoxythiocarbonyl group, a thioacyloxy group, an (alkylthio)carbonyl group, an (arylthio)carbonyl group, an (arylthio)thiocarbonyl group, an (alkylthio) thiocarbonyl group, a thioacylthio group, a carbamoyl group, an aryl- or heterocyclic-azo group, an imido group, a phosphino group, a phosphinyl group, a phosphinyloxy group, a phosphinylamino group, and a silyl group.

Among these, preferred examples include a halogen atom, an alkyl group, a cycloalkyl group, a bicycloalkyl group, a cycloalkenyl group, a bicycloalkenyl group, an aryl group, a heterocyclic group (preferably a 5- or 6-membered substituted or unsubstituted heterocyclic group, that is a monovalent group obtained by removing one hydrogen atom from an aromatic or non-aromatic heterocyclic compound), a cyano group, a nitro group, an alkoxy group, an aryloxy group, a heterocyclic oxy group, an alkylthio group, an arylthio group, a heterocyclic thio group, an alkyl- or aryl-sulfinyl group, an alkyl- or aryl-sulfonyl group, and a silyl group.

Also, these substituents may also be further substituted. In that case, examples of the substituents include the substituents described above.

Among the substituents that may be carried by these alkyl group, cycloalkyl group, aryl group and aromatic heterocyclic group, an electron-withdrawing group is preferred, and a group having a Hammett substituent constant $\sigma_m$ value of 0 or more is preferred. The Hammett substituent constant $\sigma_m$ value is detailed in, for example, "Lange's Handbook of Chemistry" 12th edition by J. A. Dean, 1979 (McGraw-Hill), "Kagaku no Ryoiki" special issue, No. 122, pp. 96 to 103, 1979 (Nankodo). Among the substituents that may be carried by these alkyl group, cycloalkyl group, aryl group and aromatic heterocyclic group, more preferred examples include substituents selected from a halogen atom (for example, a fluorine atom, a chlorine atom, a bromine atom, or an iodine atom), an alkoxy group (preferably having 1 to 30 carbon atoms; for example, methoxy, ethoxy, isobutoxy, n-octyloxy, or 2-ethylhexyloxy), an aryloxy group (preferably having 6 to 30 carbon atoms; for example, phenoxy or naphthoxy), an alkylthio group (preferably having 1 to 30 carbon atoms; for example, methylthio, ethylthio, n-octylthio, 2-ethylhexylthio, or n-decylthio), an arylthio group (preferably having 6 to 30 carbon atoms; for example, phenylthio or naphthylthio), an acyl group (preferably having 1 to 30 carbon atoms, including a formyl group, an alkylcarbonyl group, an arylcarbonyl group, and a heterocyclic carbonyl group; for example, formyl, acetyl, propionyl, isobutyryl, pivaloyl, acryloyl, oleoyl, benzoyl, naphthoyl, furoyl, thienoyl, or nicoinoyl), an alkoxycarbonyl group (preferably having 2 to 30 carbon atoms; for example, methoxycarbonyl, ethoxycarbonyl, benzylcarbonyl, n-octyloxycarbonyl, or 2-ethylhexylcarbonyl), and an aryloxycarbonyl group (preferably having 7 to 30 carbon atoms; for example, phenoxycarbonyl or naphthoxycarbonyl), an acyloxy group (preferably having 1 to 30 carbon atoms, including a formyloxy group, an alkylcarbonyloxy group, an arylcarbonyloxy group, and a heterocyclic carbonyloxy group; for example, formyloxy, acetyloxy, propionyloxy, isobutyryloxy, pivaloyloxy, acryloyloxy, oleoyloxy, benzoyloxy, naphthoyloxy, furoyloxy, thienoyloxy, or nicoinoyloxy), an alkyl- or arylsulfonyloxy group (preferably an alkylsulfonyl group having 2 to 30 carbon atoms, or an arylsulfonyl group having 6 to 30 carbon atoms; for example, methanesulfonyl, ethanesulfonyl, n-octanesulfonyl, benzenesulfonyl, or naphthalenesulfonyl), a cyano group, an alkoxycarbonyloxy group (preferably having 2 to 30 carbon atoms; for example, methoxycarbonyloxy, ethoxycarbonyloxy, or 2-ethylhexyloxycarbonyloxy), an aryloxycarbonyloxy group (preferably having 7 to 30 carbon atoms; for example, phenoxycarbonyloxy, 4-methylphenoxycarbonyloxy, or naphthyloxycarbonyloxy), an alkoxythiocarbonyl group (preferably having 2 to 30 carbon atoms; methoxythiocarbonyl, ethoxythiocarbonyl, 2-ethylhexyloxythiocarbonyl, or n-dodecyloxythiocarbonyl), an aryloxythiocarbonyl group (preferably having 7 to 30 carbon atoms; for example, phenyloxythiocarbonyl, 3-methylphenyloxythiocarbonyl, or naphthyloxythiocarbonyl), an (alkylthio)carbonyl group (preferably having 2 to 30 carbon atoms; for example, (methylthio)carbonyl, (ethylthio)carbonyl, or (isopropylthio)carbonyl, (2-ethylhexylthio)carbonyl), an (arylthio)carbonyl group (preferably having 7 to 30 carbon atoms; (phenylthio) carbonyl or (naphthylthio)carbonyl), a thioacyloxy group (preferably having 1 to 30 carbon atoms, including a thioformyloxy group, an alkylcarbothioyloxy group, an arylcarbothioyloxy group, and a heterocyclic carbothioyloxy group; for example, thioformyloxy, thioacetyloxy, thiopropionyloxy, thioisobutyryloxy, thiopivaloyloxy, thioacryloyloxy, thiooleoyloxy, thiobenzoyloxy, thionaphthoyloxy, thiofuroyloxy, thiothienoyloxy, or thionicoinoyloxy), an (alkylthio)thiocarbonyl group (preferably having 2 to 30 carbon atoms; for example, (methylthio)thiocarbonyl, (ethylthio)thiocarbonyl, or (2-ethylhexylthio)thiocarbonyl), an (arylthio)thiocarbonyl group (preferably having 7 to 30 carbon atoms, including (phenylthio)carbonyl) or (naphthylthio) thiocarbonyl)), and a thioactylthio group (preferably having 1 to 30 carbon atoms, including a thioformylthio group, an alkylcarbothioylthio group, an arylcarbothioylthio group, and a heterocyclic carbothioylthio group; for example, thioformylthio, thioacetylthio, thiopropionylthio, thioisobutyrylthio, thiopivaloylthio, thioacryloylthio, thiooleoylthio, thiobenzoylthio, thionaphthoylthio, thiofuroylthio, thiothienoylthio, or thionicoinoylthio).

Among these, preferred are substituents selected from a halogen atom, an alkoxy group, an aryloxy group, an alkylthio group, an arylthio group, an acyl group, an alkyl or arylsulfonyl group, and a cyano group.

According to the present invention, among these, a preferred structural unit of the structural unit represented by Formula (I) is represented by the following Formula (I-1):

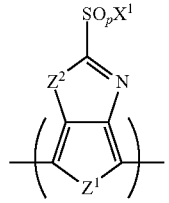

Formula (I-1)

In Formula (I-1), $Z^1$, $Z^2$ and p have the same meaning as $Z^1$, $Z^2$ and p in Formula (I), respectively. $X^1$ represents an alkyl group, a cycloalkyl group, an aryl group, an aromatic heterocyclic group or —NR$^3$(R$^4$). R$^3$ and R$^4$ each independently represent a hydrogen atom, an alkyl group, a cycloalkyl group, an aryl group or an aromatic heterocyclic group. R$^3$ and R$^4$ may bond with each other to form a ring.

$Z^1$, $Z^2$ and p have the same meaning as $Z^1$, $Z^2$ and p in Formula (I), respectively, and preferable ranges thereof are also the same. A preferred range of —SO$_p$X$^1$ is also the same as the preferred range of —SO$_p$X for Formula (I).

Meanwhile, in regard to the linkage positions (4-position and 6-position) of the structural units for the polymer, the direction of adjoining structural units is not particularly limited, and the 4-positions may be bonded to each other, or the 6-positions may be bonded to each other. The linkage may be in a random fashion, or the 4-position and the 6-position may be linked in a regular fashion. Since the crystallinity of the polymer thus obtainable may be increased, and also the short circuit current Jsc of the photovoltaic cell thus obtainable may be increased, it is preferable that the 4-position and the 6-position be regularly linked.

Hereinbelow, a preferred structure of the case where $X^1$ and p are combined can be represented by the following Formula (I-1A), Formula (I-1B) or Formula (I-1C):

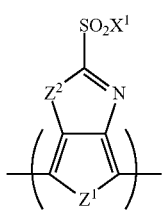
Formula (I-1A)

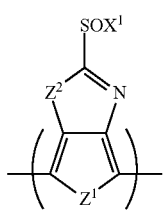
Formula (I-1B)

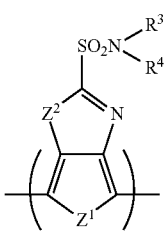
Formula (I-1C)

In Formulae (I-1A) to (I-1C), $Z^1$ and $Z^2$ have the same meanings as $Z^1$ and $Z^2$ of Formula (I-1), respectively, and preferred ranges thereof are also the same. $X^1$ represents an alkyl group, a cycloalkyl group, an aryl group or an aromatic heterocyclic group, and $X^1$ is preferably an alkyl group, a cycloalkyl group, or an aryl group, more preferably an alkyl group or an aryl group, and most preferably an alkyl group. $R^3$ and $R^4$ have the same meanings as $R^3$ and $R^4$ for Formula (I-1), respectively, and preferred ranges thereof are also the same.

Furthermore, among the structures represented by Formula (I-1A) to Formula (I-1C), the structures represented by Formula (I-1A) and Formula (I-1B) are preferred, and the structure represented by Formula (I-1A) is more preferred.

Specific examples of structural unit represented by Formula (I) are shown in the followings, but the present invention is not limited thereto.

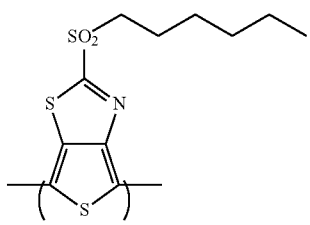
I-1

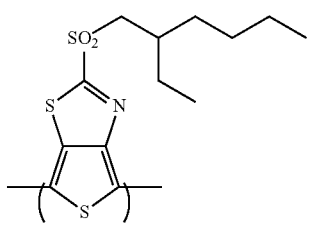
I-2

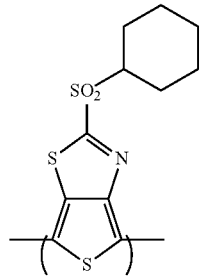
I-3

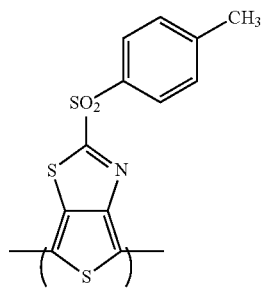
I-4

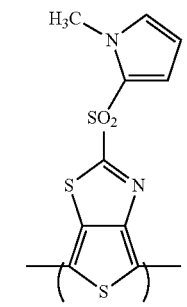
I-5

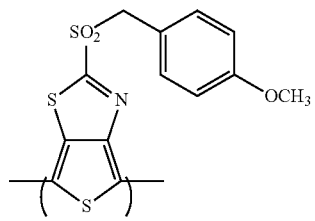
I-6

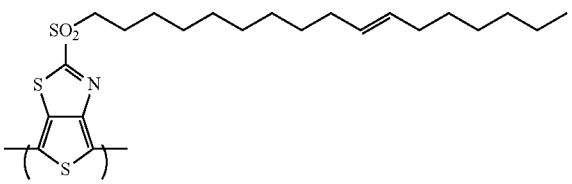
I-7

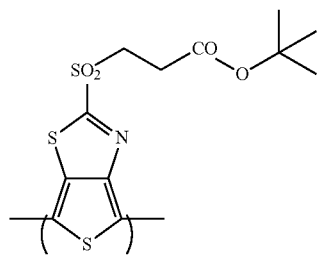
I-8

-continued
I-9
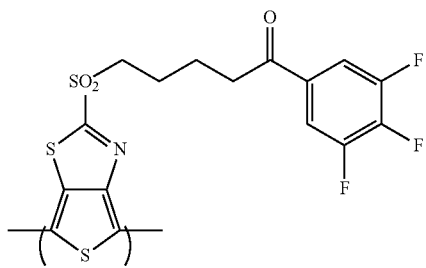
I-10
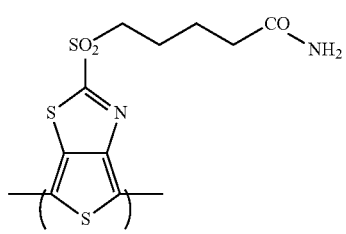
I-11
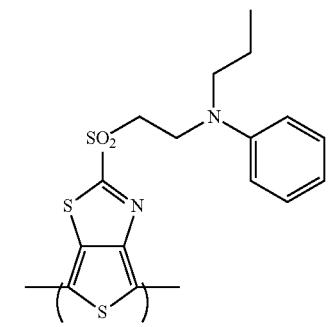
I-12
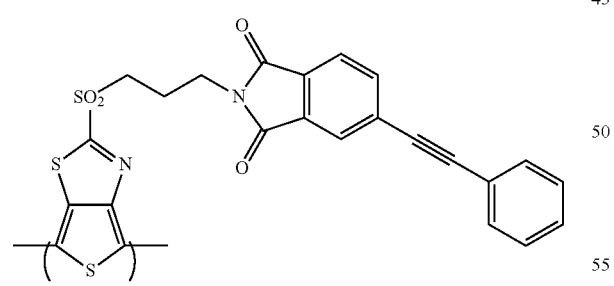
I-13
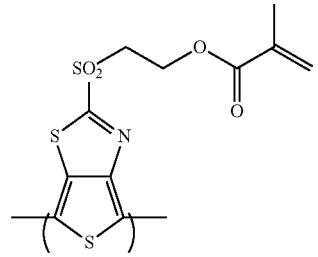
-continued
I-14
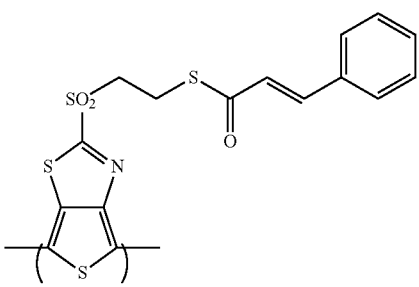
I-15
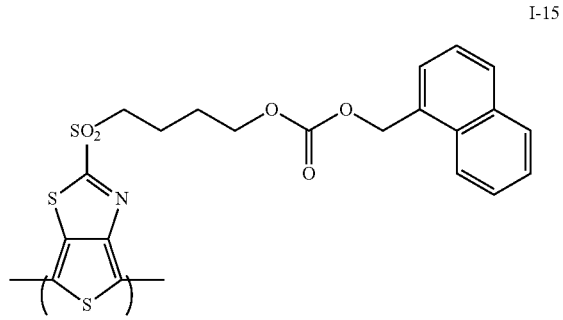
I-16
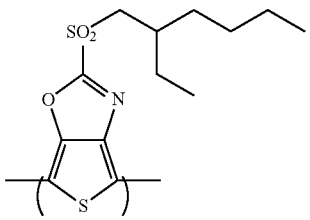
I-17
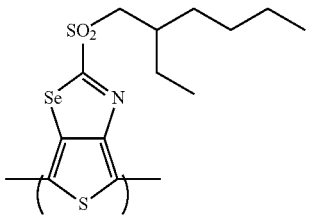
I-18
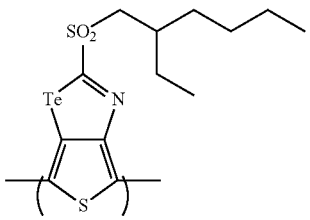
I-19
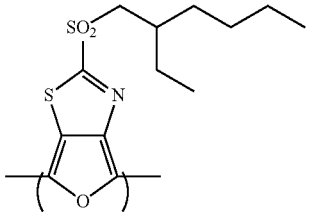

I-20
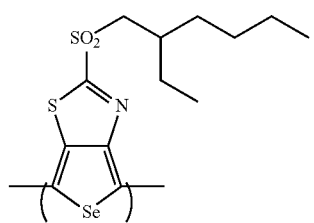
I-21
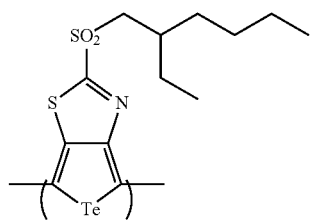
I-22
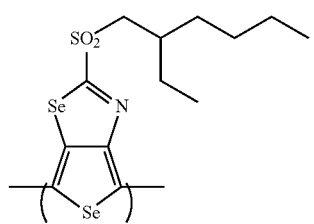
I-23
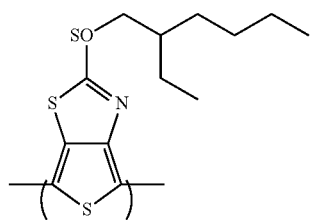
I-24
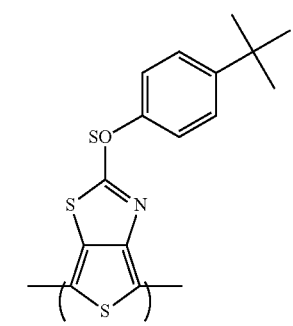
I-25
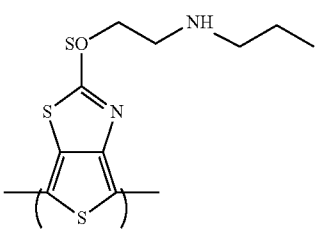
I-26
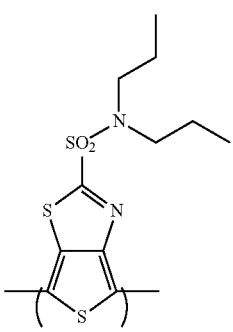
I-27
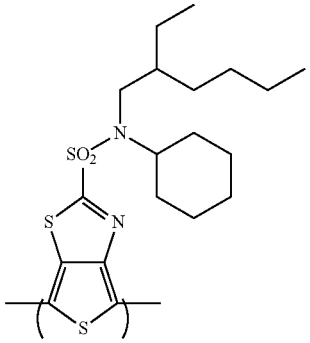
I-28
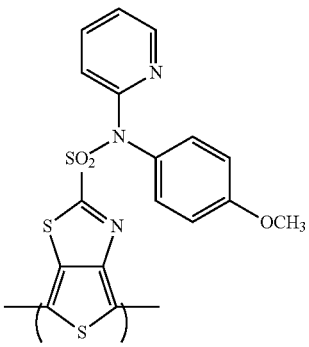
I-29
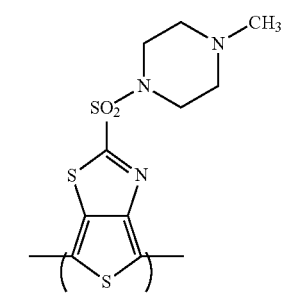
I-30
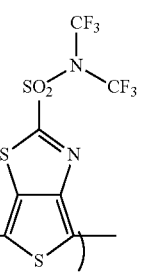

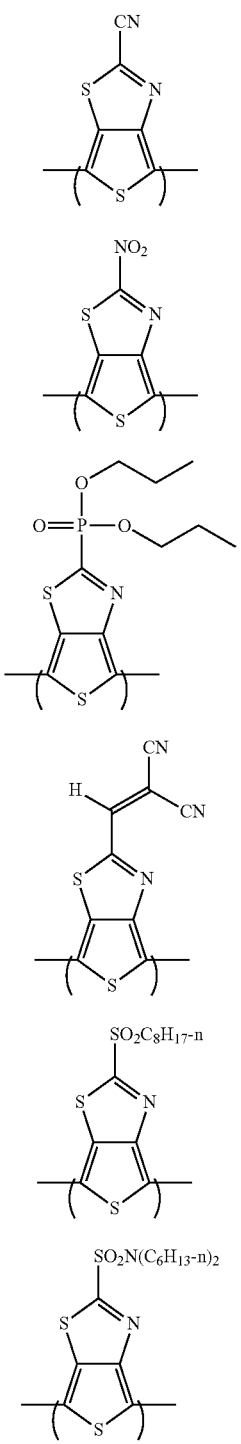

I-31

I-32

I-33

I-34

I-35

I-36

The structural unit represented by Formula (I) of the present invention can be easily synthesized by a cross-coupling reaction or the like referring to, for example, the methods described in J. Chem. Soc. Chem. Commun, p. 866 (1979) and Angew. Chem. Int. Ed. 25, p. 508 (1986) or methods equivalent to these methods. Here, the organotin compound of the raw material can be easily synthesized referring to, for example, the method described in Chem. Lett. 1977, p. 301 or the like.

The polymer of the present invention is a polymer having at least the structural unit represented by Formula (I); however, the polymer may be any one of a homopolymer formed from one kind of the structural unit represented by Formula (I), a copolymer of a combination of any of the structural units of Formulae (I-1) to (I-1C), and a copolymer with a structural unit other than the structural unit of Formula (I).

In the case of a copolymer, regarding the structural unit other than the structural unit represented by Formula (I) of the present invention, the structural unit which can be linked each other to the structural units represented by Formula (I) by a π-electron conjugated system is used. Any structural unit may be used as long as such structural units can be conjugated by a π-electron conjugated system and the π-electron conjugated system can cover the entire polymer molecule.

Examples of the structural unit other than the structural unit represented by Formula (I) of the present invention that forms a copolymer, include a thiophene structural unit, a thiophene oxide structural unit, a silacyclopentadithiophene structural unit, a cyclopentadithiazole structural unit, a benzothiazole structural unit, a thiadiazoloquinoxaline structural unit, a cyclopentadithiophene structural unit, a cyclopentadithiophene oxide structural unit, a benzoisothiazole structural unit, a benzothiazole structural unit, a thiophene oxide structural unit, a thienothiophene structural unit, a thienothiophene oxide structural unit, a dithienothiophene structural unit, a dithienothiophene oxide structural unit, a tetrahydroisoindole structural unit, a fluorene structural unit, a fluorenone structural unit, an indenofluorene structural unit, a thiazole structural unit, a selenophene structural unit, a silol structural unit, a thiazolothiazole structural unit, a naphthothiadiazole structural unit, a thienopyrazine structural unit, an oxazole structural unit, an imidazole structural unit, a pyrimidine structural unit, a benzoxazole structural unit, a benzimidazole structural unit, a thienothiazole structural unit, a dithienopyrrole structural unit, a carbazole structural unit, a benzodithiophene structural unit, and a cyclopentadipyridine structural unit.

In regard to these structural units, preferably, a structural unit represented by the following Formula (II) is more preferred.

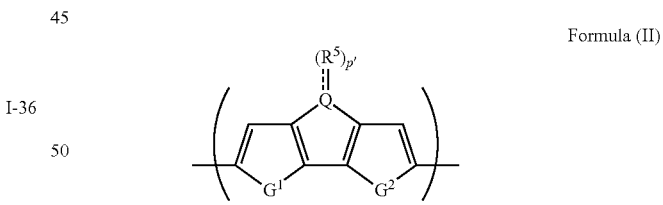

Formula (II)

In Formula (II), Q represents Si, S, O or N. $G^1$ and $G^2$ each independently represent S, O, Se or Te. $R^5$ represents a hydrogen atom, an alkyl group, a cycloalkyl group, an aryl group, an aromatic heterocyclic group or an oxygen atom. p' represents 0, 1 or 2; when p' is 2, two $R^5$'s may be the same or different from each other. Herein, the bond between Q and $R^5$ is such that when Q is Si or N, the bond is a single bond, and when Q is S, the bond is a double bond and $R^5$ is an oxygen atom. Furthermore, when Q is O, p' represents 0, and when Q is N, p' represents 1.

Here, it is preferable that when Q is Si, p' represent 2, and when Q is S or O, p' represent 0.

Q is preferably Si, S or O, more preferably Si or O, and most preferably Si.

$G^1$ and $G^2$ are each independently preferably S, O or Se, more preferably S or O, and most preferably S.

When $R^5$ represents a group other than an oxygen atom, $R^5$ has the same meaning as $R^1$ and $R^2$ for Formula (I-1), and a preferred range thereof is also the same.

Here, in regard to $R^5$, when p' is 2, and Q is Si, it is preferable that one of $R^5$'s represent an alkyl group, a cycloalkyl group, an aryl group, or an aromatic heterocyclic group, while the other $R^5$ represent a hydrogen atom, an alkyl group, a cycloalkyl group, an aryl group or an aromatic heterocyclic group; it is more preferable that one of $R^5$'s represent an alkyl group or an aryl group, while the other $R^5$ represent a hydrogen atom, an alkyl group, a cycloalkyl group, an aryl group or an aromatic heterocyclic group; it is even more preferable that two $R^5$'s together represent a group selected from an alkyl group and an aryl group; and it is particularly preferable that two $R^5$'s together represent an alkyl group.

Furthermore, in regard to $R^5$, when p' is 1, and Q is N, it is preferable that $R^5$ represent a hydrogen atom, an alkyl group, a cycloalkyl group, an aryl group, or an aromatic heterocyclic group; more preferably an alkyl group, a cycloalkyl group, an aryl group, or an aromatic heterocyclic group; and even more preferably an alkyl group or an aryl group.

Furthermore, when Q is S, the bond between $R^5$ and Q is a double bond, while $R^5$ represents an oxygen atom, and p' represents 0, 1 or 2. That is, the group composed of Q and $R^5$ represents —S— when p' is 0, —SO— when p' is 1, and —SO$_2$— when p' is 2.

Specific examples of structural unit represented by Formula (II) are shown in the followings, but the present invention is not limited thereto.

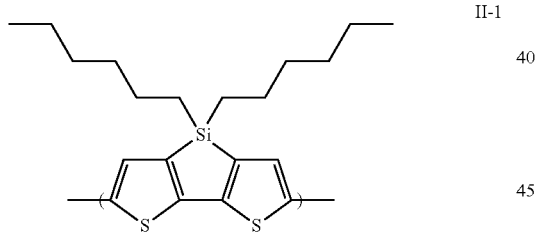

II-1

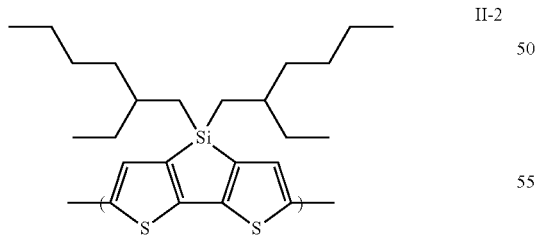

II-2

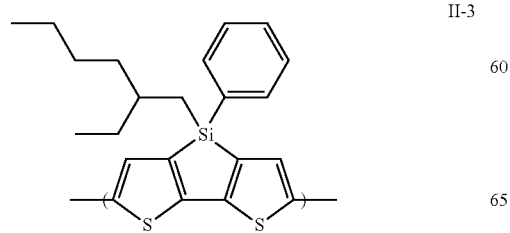

II-3

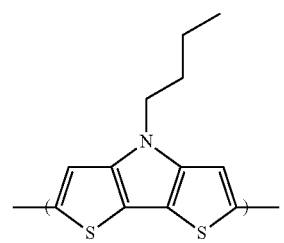

II-4

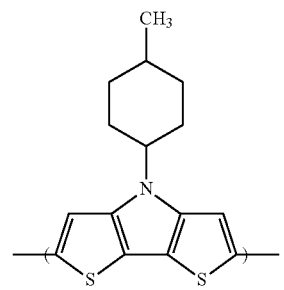

II-5

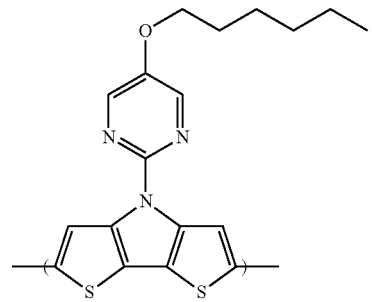

II-6

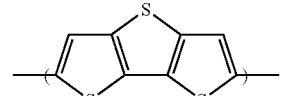

II-7

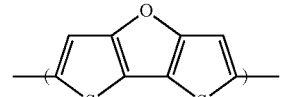

II-8

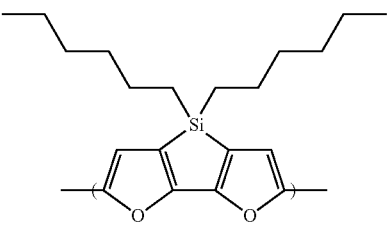

II-9

-continued

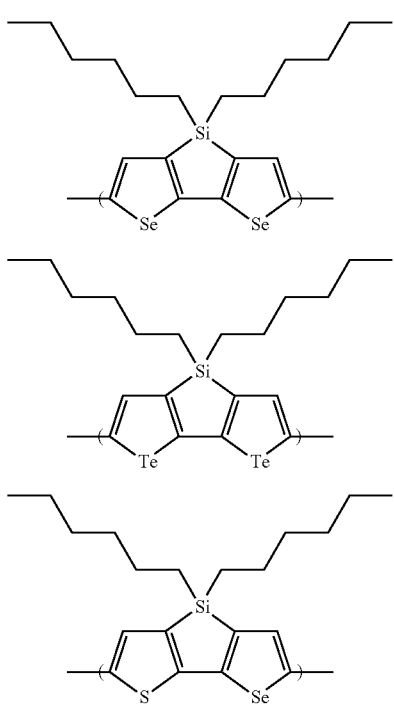

II-10

II-11

II-12

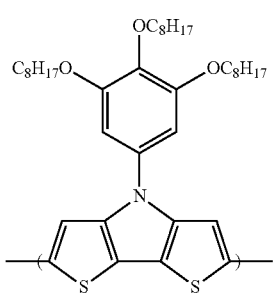

II-13

The structural unit represented by Formula (II) of the present invention can be easily synthesized referring to the same method as that used for the structural unit represented by Formula (I).

The polymer having the structural unit represented by Formula (I) of the present invention and the structural unit represented by Formula (II) of the present invention can be easily synthesized referring to the methods described in Synthetic Communications, Vol. 11, No. 7, p. 513 (1981); Makromolekulare Chemistry, Rapid Communications, vol. 12, p. 489 (1992); and Polymer, Vol. 38, p. 1221 (1997), or methods equivalent thereto.

Specific examples of copolymer of the present invention are shown in the followings, but the present invention is not limited thereto.

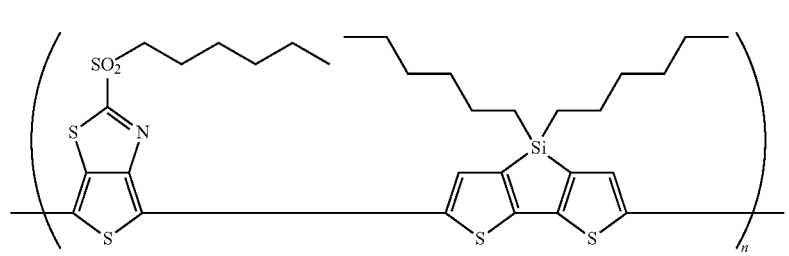

III-1

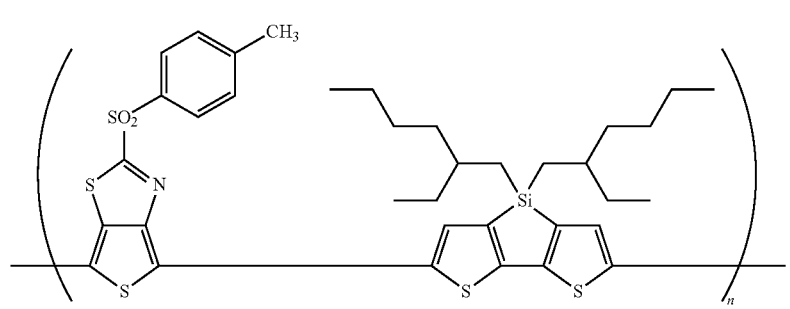

III-2

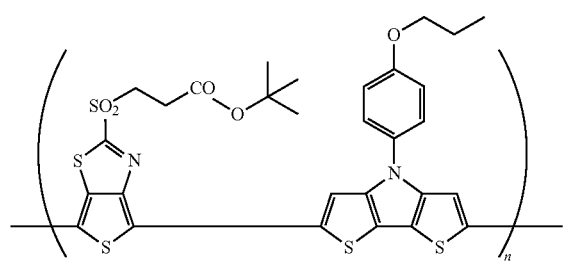

III-3

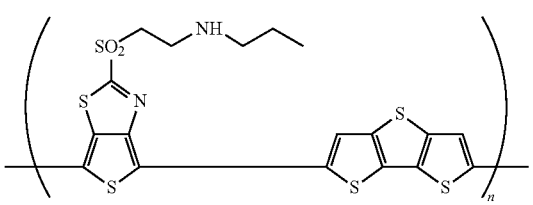

III-4

-continued

III-5
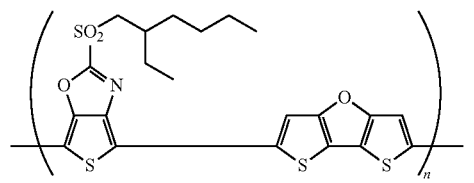

III-6
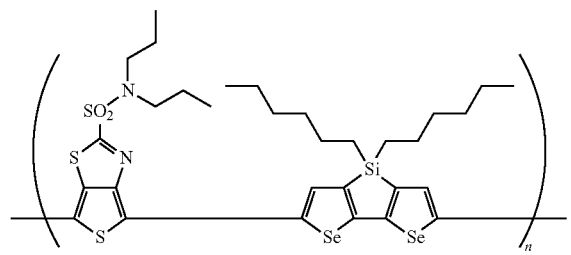

III-7
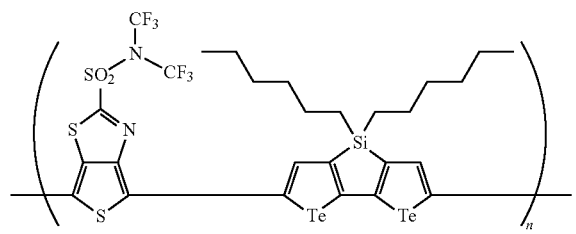

III-8
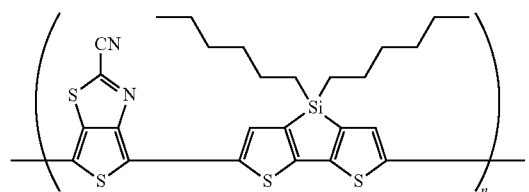

III-9
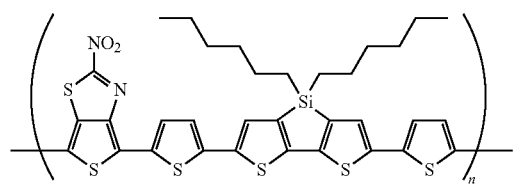

III-10
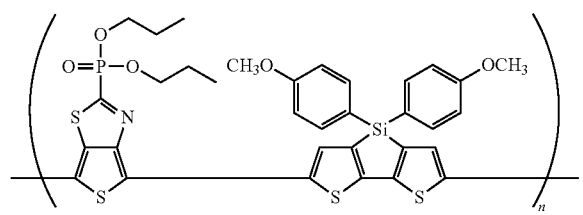

III-11
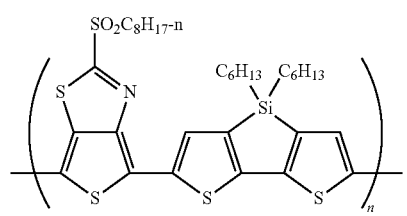

III-12
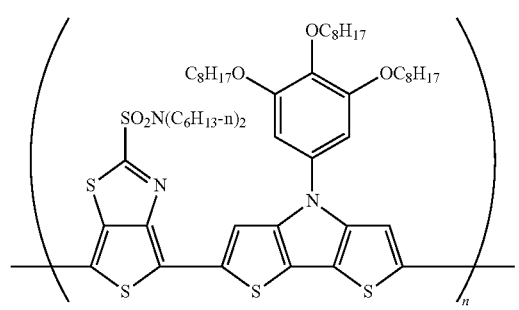

III-13
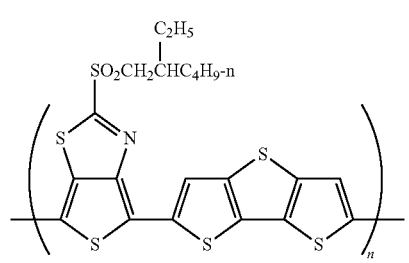

III-14
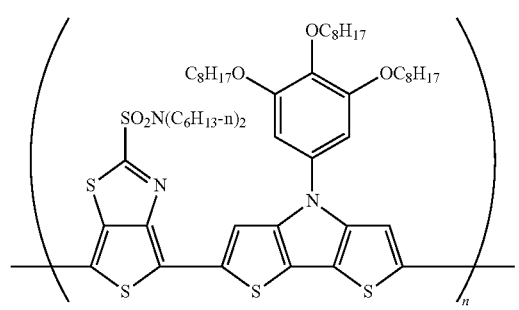

<Organic Semiconductor Polymer>

A polymer having the structural unit represented by Formula (I) of the present invention is useful as an organic semiconductor polymer. An organic semiconductor polymer is a polymer of an organic compound capable of exhibiting the properties as a semiconductor, and the polymer of the present invention is particularly useful as a p-type organic semiconductor polymer. Meanwhile, a p-type organic semiconductor compound, including a polymer, is generally a π-electron conjugated compound having a highest occupied molecular orbital (HOMO) energy level of 4.5 eV to 6.0 eV.

Organic semiconductor polymers are used in organic electroluminescent elements that emit light when electricity is passed, organic photoelectric conversion elements that generate power when irradiated with light, organic thin film transistor elements that control the amount of current or the amount of voltage, electrochemical sensors, printable circuits, and the like, which are used in the field of organic electronics. In the present invention, it is preferable to use organic semiconductor polymer in photovoltaic cells, and particularly in organic thin film solar cells.

<Composition for Organic Semiconductor Material>

The composition for organic semiconductor material of the present invention will be described.

The polymer having a structural unit represented by Formula (I) of the present invention is useful as a p-type organic semiconductor polymer, and the composition for organic semiconductor material of the present invention contains this polymer having a structural unit represented by Formula (I) and an n-type semiconductor compound, and particularly according to the present invention, it is preferable that the composition for organic semiconductor material contains an n-type organic semiconductor compound. Furthermore, if necessary, the composition for organic semiconductor material may contain a p-type organic semiconductor compound other than the polymer having a structural unit represented by Formula (I), and a compound other than semiconductor (for example, examples of the other p-type semiconductor compound include poly-3-hexylthiophene (P3HT), poly[2-methoxy-5-(2-ethylhexyloxy)-1,4-phenylenevinylene (MEH-PPV), poly[2-methoxy-5-(3',7'-dimethyloctyloxy)-1,4-phenylenevinylene] (MDMO-PPV), poly[(9,9-di-n-octylfluorenyl-2,7-diyl)-alt-(benzo[2,1,3]thiadiazole-4,8-diyl)] (F8BT); and examples of the compound other than semiconductor include other polymers such as a polyester-based resin and a methacrylic resin that will be described below). When the mass of the composition is designated as 100, the composition contains 10 to 90 of the polymer having a structural unit represented by Formula (I), 10 to 90 of an n-type organic semiconductor compound, 0 to 50 of a p-type organic semiconductor compound other than the polymer having a structural unit represented by Formula (I), and 0 to 50 of a compound other than semiconductor.

(N-Type Organic Semiconductor Compound)

There are no particular limitations on the n-type organic semiconductor compound. Generally, the n-type organic semiconductor compound is a π-electron conjugated compound having a minimum unoccupied molecular orbital (LUMO) energy level of 3.5 eV to 4.5 eV, and examples thereof include fullerene or a derivative thereof; carbon nanotubes, carbon nanohorns, or a derivative thereof; octaazaporphyrin; perfluoro compounds obtained by substituting the hydrogen atoms of a p-type organic semiconductor compound with fluorine atoms (for example, perfluoropentacene or perfluorophthalocyanine); and polymer compounds containing aromatic carboxylic acid anhydrides or imidation products thereof as skeletal structures, such as naphthalene-tetracarboxylic acid anhydride, naphthalenetetracarboxylic acid diimide, perylenetetracarboxylic acid anhydride, and perylenetetracarboxylic acid diimide.

Among these n-type organic semiconductor compounds, fullerene or a derivative thereof, and carbon nanotubes, carbon nanohorns or a derivative thereof are preferred, and fullerene or a derivative thereof is more preferred, so that electrical charge separation from the organic semiconductor polymer having a structural unit represented by Formula (I) of the present invention (p-type organic semiconductor compound) can be achieved rapidly and efficiently.

Examples of the fullerenes, carbon nanotubes, carbon nanohorns or a derivative thereof include fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nanotube, multi wall carbon nanotube, single wall carbon nanotube, and carbon nanohorn (cone type) and a fullerene derivative a part of which is substituted with a hydrogen atom, a halogen atom, a substituted or unsubstituted alkyl group, alkenyl group, alkynyl group, aryl group, heteroaryl group, cycloalkyl group, silyl group, ether group, thioether group, amino group or silyl group.

As the fullerene derivative, a phenyl-$C_{61}$-butyric acid ester, a diphenyl-$C_{62}$-bis(butyric acid ester), a phenyl-$C_{71}$-butyric acid ester, a phenyl-$C_{85}$-butyric acid ester, or a thienyl-$C_{61}$-butyric acid ester is preferred, and the number of carbon atoms of the alcohol moiety of the butyric acid esters is preferably 1 to 30, more preferably 1 to 8, even more preferably 1 to 4, and most preferably 1.

Preferred examples of the fullerene derivative include phenyl-$C_{61}$-butyric acid methyl ester ([60]PCBM), phenyl-$C_{61}$-butyric acid n-butyl ester ([60]PCBnB), phenyl-$C_{61}$-butyric acid isobutyl ester ([60]PCBiB), phenyl-$C_{61}$-butyric acid n-hexyl ester ([60]PCBH), phenyl-$C_{61}$-butyric acid n-octyl ester ([60]PCBO), diphenyl-$C_{62}$-bis(butyric acid methyl ester)(bis[60]PCBM), phenyl-$C_{71}$-butyric acid methyl ester ([70]PCBM), phenyl-$C_{85}$-butyric acid methyl ester ([84]PCBM), thienyl-$C_{61}$-butyric acid methyl ester ([60]ThCBM), $C_{60}$ pyrrolidine tris-acid, $C_{60}$ pyrrolidine tris-acid ethyl ester, N-methylfulleropyrrolidine (MP-$C_{60}$), (1,2-methanofullerene $C_{60}$)-61-carboxylic acid, (1,2-methanofullerene $C_{60}$)-61-carboxylic acid t-butyl ester, metallocene-doped fullerene of JP-A-2008-130889 and the like, and fullerene having a cyclic ether group of U.S. Pat. No. 7,329,709 and the like.

The composition for organic semiconductor material of the present invention may contain another p-type semiconductor compound (a condensed low-molecular weight polycyclic aromatic compound, oligomer or polymer), together with the polymer having a structural unit represented by Formula (I) of the present invention.

Examples of the condensed low-molecular weight polycyclic aromatic compound as the p-type semiconductor compound include compounds such as anthracene, tetracene, pentacene, hexacene, heptacene, chrysene, pysene, fuluminene, pyrene, perpyrene, perylene, terylene, quoterylene, coronene, ovalene, circumanthracene, bisanthene, zethrene, heptazethrene, pyranthrene, violanthene, isoviolanthene, circobiphenyl, and anthradithiophene; porphyrin or copper phthaloeyanine, tetrathiafulvalene (TTF)-tetracyanoquinodimethane (TCNQ) complex, bisethylenetetrathiafulvalene (BEDTTTF)-perchloric acid complex, and derivatives or precursors thereof.

Examples of a derivative containing the condensed polycyclic compound include pentacene compounds having a substituent disclosed in WO 03/16599, WO 03/28125, U.S. Pat. No. 6,690,029 and JP-A-2004-107216; pentacene precursors disclosed in US 2003/136964; substituted acenes with a trialkylsilylethynyl group disclosed in J. Amer. Chem. Soc., vol. 127, p. 4986 (2005), J. Amer. Chem. Soc., vol. 123, p. 9482 (2001), and J. Amer. Chem. Soc., vol. 130, p. 2706 (2008); and porphyrin-series compounds disclosed in JP-A-2008-16834.

Examples of the conjugate polymer or oligomer as the p-type semiconductor compound include polymer materials such as polythiophene such as poly(3-hexylthiophene) (P3HT) and oligomer thereof; polythiophene having a polymerizable group described in Technical Digest of the International PVSEC-17, Fukuoka, Japan, 2007. p. 1225; polythiophene-thienothiophene copolymer described in Nature Material, (2006) vol. 5, p. 328; polythiophene-diketopyrrolopyrrol copolymer described in WO 2008/000664; polythiophene-thiazolothiazole copolymer described in Adv. Mater, 2007, p. 4160; polythiophene copolymer such as PCP-DTBT described in Nature Mat. vol. 6 (2007), p. 497; polypyrrole and its oligomer; polyaniline, polyphenylene and its oligomer, polyphenylene vinylene and its oligomer; polythienylene vinylene and its oligomer; and δ conjugate type polymer such as polyacetylene, polydiacetylene, polysilane, and polygermane. As an oligomer material, appropriately used are oligomers such as α-sexithiophene, α,ω-dihexyl-α-sexithiophene, α,ω-dihexyl-α-quinquethiophene, α,ωw-bis(3-butoxypropyl)-α-sexithiophene, all of which are thiophene hexamer.

(Photoelectric Conversion Layer)

The composition for organic semiconductor material of the present invention is preferably used as a composition for coating of a photoelectric conversion layer (particularly a bulk heterojunction layer). The mixing ratio of the p-type organic semiconductor compound which is an electron donor material, to the n-type semiconductor compound which is an electron accepting material is adjusted such that the photoelectric conversion efficiency would become the highest. Usually, the mixing ratio is selected from the range of 10:90 to 90:10, and preferably 20:80 to 80:20, as a mass ratio. Regarding the method for forming such a mixed layer, for example, a co-deposition method is used. Alternatively, the mixed layer can also formed by a coating method using a solvent which can dissolve both the organic materials. In order to increase the area of the interface at which charge separation of holes and electrons occurs, and to obtain high photoelectric conversion efficiency, a coating method is preferred.

Here, for the purpose of promoting the phase separation of the electron donating region (donor) and the electron accepting region (acceptor) in the photoelectric conversion layer, crystallization of the organic materials contained in the photoelectric conversion layer, transparentization of the electron transport layer, and the like, the photoelectric conversion layer may be subjected to a heating treatment (annealing) by various methods. In the case of a dry film forming method such as deposition, for example, there is available a method of heating the substrate temperature to 50° C. to 150° C. during film formation. In the case of a wet film forming method such as printing or coating, there is available a method of adjusting the drying temperature after coating to 50° C. to 150° C. Furthermore, the photoelectric conversion layer may also be heated to 50° C. to 150° C. in a post-process, for example, after completion of the formation of a metal negative electrode. As the phase separation is promoted, the carrier mobility increases, and high photoelectric conversion efficiency can be obtained.

<Photoelectric Conversion Element, Photovoltaic Cell>

Hereinafter, a photoelectric conversion element that uses the polymer of a structural unit represented by Formula (I) of the present invention or the composition for organic semiconductor material of the present invention, and a photovoltaic cell as a representative example of the photoelectric conversion element will be described.

In a photovoltaic cell, and particularly in an organic thin film solar cell, the composition for organic semiconductor material of the present invention is used as the photoelectric conversion layer described above, and particularly preferably as a bulk heterojunction layer.

Photovoltaic cells, and particularly the organic thin film solar cells, are generally classified into p-i-n junction type organic thin film solar cells having a p-i-n trilayer structure, and bulk heterojunction type organic thin film solar cells. In the present invention, any of them may be used, but the present invention is particularly preferably applied to bulk heterojunction type organic thin film solar cells.

In a photovoltaic cell, the photoelectric conversion layer, and particularly the bulk heterojunction layer in a bulk heterojunction type organic thin film solar cell, is formed using the composition for organic semiconductor material of the present invention. This photoelectric conversion layer may be composed of a single layer, or may be composed of plural layers in which the kinds and mixing ratio of the p-type semiconductor compound, which is an electron donor compound, to an n-type semiconductor compound, which is an electron acceptor compound, are varied.

This photoelectric conversion layer is provided between a first electrode and a second electrode. In the present invention, it is preferable to provide a hole transport layer between the first electrode and the photoelectric conversion layer, and it is also preferable to provide an electron transport layer between the second electrode and the photoelectric conversion layer. It is particularly preferable to provide a hole transport layer between the first electrode and the photoelectric conversion layer, and to provide an electron transport layer between the photoelectric conversion layer and the second electrode.

As these hole transport layer and electron transport layer are provided, electrical charges generated at the photoelectric conversion layer can be extracted more efficiently.

(Electrode)

The photoelectric conversion element according to the present invention includes at least a first electrode and a second electrode. The first electrode and the second electrode are such that any one of them serves as a positive electrode, and the other serves as a negative electrode. Furthermore, in the case of adopting a tandem configuration, a tandem configuration can be achieved by using an intermediate electrode. Meanwhile, in the present invention, the electrode through which primarily holes flow is referred to as a positive electrode, while the electrode through which primarily electrons flow is referred to as a negative electrode. Furthermore, in view of the function of having light transmissibility or not, an electrode having light transmissibility is referred to as a transparent electrode, and an electrode having no light transmissibility is referred to as a counter electrode or a metal electrode. Usually, the positive electrode is a transparent electrode having light transmissibility, while the negative electrode is a counter electrode or a metal electrode having no light transmissibility. However, both the first electrode and the second electrode can be made into transparent electrodes.

(First Electrode)

The first electrode is a cathode. In the case using it for a solar cell, it is preferably an electrode transmitting a light of from visible light to near infrared light (380 to 800 nm). Examples of a material which can be used include transparent conductive metal oxides of indium tin oxide (ITO), $SnO_2$, and ZnO; a metal nanowire; and a carbon nanotubes. Further, it can be used a conductive polymer selected from the group consisting of derivatives of polypyrrole, polyaniline, polythiophene, polythienylene vinylene, polyazulene, polyisothianaphthene, polycarbazole, polyacethylene, polyphenylene, polyphenylene vinylene, polyacene, polyphenylacetylene, polydiacetylene, and polynaphthalene. Furthermore, a plural number of these electrically conductive compounds can be combined, and the combination can be used in the positive electrode. Meanwhile, in the case where light transmissibility is not required, the positive electrode may be formed using a metal material such as nickel, molybdenum, silver, tungsten, or gold. In the case where a transparent solar cell is to be produced, the transmittance of the positive electrode is preferably such that the average light transmittance at the thickness used in solar cells (for example, a thickness of 0.2 µm) in the wavelength range of 380 nm to 800 nm is preferably 75% or more, and more preferably 85% or more.

(Second Electrode)

The second electrode of the present invention is a negative electrode, and is a metal negative electrode having a standard electrode potential of a positive value.

The negative electrode may be an independent layer made of a conductive material, in addition to the material which has conductivity, it may be used a resin which holds such material together. As a conducting material used for a negative electrode, it can be used: a metal, an alloy, an electric conductive compound, and a mixture thereof, which has a small work function (4 eV or less). Specific examples of such electrode material include sodium, a sodium potassium alloy, magnesium, lithium, a magnesium/copper mixture, a magnesium/silver mixture, a magnesium/aluminum mixture, a magnesium/indium mixture, an aluminum/aluminium oxide ($Al_2O_3$) mixture, indium, a lithium/aluminium mixture and a rare earth metal. Among these, from the viewpoint of an electron taking out property and resistivity to oxidation, a mixture of these metals and the second metal having a larger work function than these metals is suitable. Examples of these include a magnesium/silver mixture, a magnesium/aluminum mixture, a magnesium/indium mixture, an aluminum/aluminium oxide ($Al_2O_3$) mixture, a lithium/aluminum mixture and aluminium. A negative electrode can be produced by using these electrode materials with a method such as a vacuum evaporation method or a sputtering method. Moreover, the coating thickness is usually chosen from the range of 10 nm to 5 µm, preferably from the range of 50 to 200 nm.

When a metallic material is used as a conducting material of the negative electrode, the light arriving at the negative electrode will be reflected and will be also reflected by the first electrode side, and this light can be reused. As a result, the light is again absorbed by the photoelectric conversion layer to result in improvement of photoelectric conversion efficiency. This is desirable. Moreover, the negative electrode may be nanoparticles, nanowires, or a nanostructure material which is made of a metal (for example, gold, silver, copper, platinum, rhodium, ruthenium, aluminium, magnesium and indium) and carbon. When it is a dispersion of nanowires, a transparent and high conductive negative electrode can be formed by a coating method, and it is preferable.

When the negative electrode side is made to be light transparent, it can be achieved as follows. After producing thin film of a conductive material suitable for negative electrodes, such as an aluminium, an aluminum alloy, silver or a silver compound to have a coating thickness of about 1 to 20 nm, a light transmitting negative electrode can be prepared by providing on the thin film with the membrane of a conductive light transparent material cited in the description of the above-mentioned positive electrode.

(Hole Transport Layer)

In the present invention, it is preferable to provide a hole transport layer between the first electrode and the photoelectric conversion layer.

Examples of the electrically conductive polymer that forms the hole transport layer include polythiophene, polypyrrole, polyaniline, polyphenylenevinylene, polyphenylene, polyacetylene, polyquinoxaline, polyoxadiazole, polybenzothiadiazole, and polymers having a plural number of these conductive skeletal structures.

Among these, polythiophene and derivatives thereof are preferred, and polyethylenedioxythiophene and polythienothiophene are particularly preferred. These polythiophenes are usually partially oxidized in order to obtain electrical conductivity. The electrical conductivity of the conductive polymer can be regulated by the degree of partial oxidation (doping amount), and as the doping amount increases, electrical conductivity increases. Since polythiophene becomes cationic as a result of partial oxidation, a counter anion for neutralizing the electrical charge is required. Examples of such a polythiophene include polyethylenedioxythiophene having polystyrene sulfonate as a counter ion (PEDOT-PSS), and polyethylenedioxythiophene having p-toluenesulfonic acid as a counter anion (PEDOT-TsO).

In the hole transport layer, another polymer may also be added thereto as long as desired electrical conductivity is not impaired. The other polymer is added for the purpose of enhancing coatability, or for the purpose of increasing the film strength. Examples of the other polymer include thermoplastic resins such as a polyester resin, a methacrylic resin, a methacrylic acid-maleic acid copolymer, a polystyrene resin, a transparent fluororesin, a polyimide, a fluorinated polyimide resin, a polyamide resin, a polyamideimide resin, a polyether imide resin, a cellulose acylate resin, a polyurethane resin, a polyether ether ketone resin, a polycarbonate resin, an alicyclic polyolefin resin, a polyallylate resin, a polyether sulfone resin, a polysulfone resin, a cycloolefin copolymer, a fluorene ring-modified polycarbonate resin, an alicyclic-modified polycarbonate resin, a fluorene ring-modified polyester resin, and an acryloyl compound; and hydrophilic polymers such as gelatin, polyvinyl alcohol, polyacrylic acid, polyacrylamide, polyvinylpyrrolidone, polyvinylpyridine, and polyvinylimidazole. These polymers may be crosslinked so as to increase the film strength.

Furthermore, in the hole transport layer, the cyan compounds and the like described in WO 2006/019270 can be used. In addition, to the hole transport layer which has a LUMO energy level shallower than the LUMO energy level of the n-type semiconductor compound used for a photoelectric conversion layer, there is provided an electron blocking function having a rectification effect by which the electron generated in the photoelectric conversion layer is not passed to the anode side. The above-described hole transport layer is also called an electron blocking layer, and it is more preferable to use a hole transport layer having such function. Examples of these materials include a triaryl amine compound described in JP-A-5-271166, a metal oxide such as molybdenum oxide, nickel oxide and tungsten oxide. Moreover, the layer which consists of the p-type semiconductor compound used for the photoelectric conversion layer can also be used. As a means to form these layers, although any one of a vacuum deposition method and a solution coating method can be used, preferably used is a solution coating method. When a coated layer is formed as an under layer before forming a photoelectric conversion layer, it will have an effect of leveling the coating surface. This will result in decreasing a leaking effect and it is preferable.

The thickness of the hole transport layer is preferably 10 nm to 500 nm, and more preferably 20 nm to 200 nm.

(Electron Transport Layer)

In the present invention, it is preferable to provide an electron transport layer between the second electrode and the photoelectric conversion layer, and it is particularly preferable to provide a hole transport layer between the first electrode and the photoelectric conversion layer and to provide an electron transport layer between the photoelectric conversion layer and the second electrode.

Examples of the electron transporting material that can be used in the electron transport layer include the n-type semiconductor compounds described above in the photoelectric conversion layer, which are electron-acceptor materials, and the materials described as electron-transporting and hole-blocking materials in Chemical Review, Vol. 107, pp. 953-1010 (2007). In the present invention, it is preferable to use an inorganic salt or an inorganic oxide. Preferred examples of the inorganic salt include alkali metal compounds such as lithium fluoride, sodium fluoride, and cesium fluoride. Various metal oxides are preferably used as materials for electron transport layer having high stability, examples thereof include lithium oxide, magnesium oxide, aluminum oxide, calcium oxide, titanium oxide, zinc oxide, strontium oxide, niobium oxide, ruthenium oxide, indium oxide, zinc oxide, and barium oxide. Among these, relatively stable aluminum oxide, titanium oxide, and zinc oxide are more preferred. The film thickness of the electron transport layer is 0.1 nm to 500 nm, and preferably 0.5 nm to 300 nm. The electron transport layer can be suitably formed by any of a wet film forming method based on coating or the like, a dry film forming method according to a PVD method such as deposition or sputtering, a transfer method, a printing method, and the like.

Meanwhile, the electron transport layer that has a HOMO energy level that is deeper than the HOMO energy level of the p-type semiconductor compound used in the photoelectric conversion layer, is imparted with a hole blocking function of having a rectification effect in which holes produced in the photoelectric conversion layer are not passed to the negative electrode side. More preferably, the material having the HOMO energy level deeper than the HOMO energy level of the n-type semiconductor compound is used as the electron transport layer. Further, in view of the characteristics of transporting electrons, it is preferable to use a compound having high electron mobility. Such an electron transport layer is also called a hole blocking layer, and it is preferable to use an electron transport layer having such a function. As such a material, phenanthrene-based compounds such as bathocuproine; n-type semiconductor compounds such as naphthalenetetracarboxylic acid anhydride, naphthalenetetracarboxylic acid diimide, perylenetetracarboxylic acid anhydride, and perylenetetracarboxylic acid diimide; n-type inorganic oxides such as titanium oxide, zinc oxide, and gallium oxide; and alkali metal compounds such as lithium fluoride, sodium fluoride, and cesium fluoride, can be used. Furthermore, a layer formed from a simple substance of the n-type semiconductor compound used in the photoelectric conversion layer can also be used.

(Support)

The support that constitutes the photovoltaic cell of the present invention is not particularly limited as long as at least a first electrode (positive electrode), a photoelectric conversion layer, and a second electrode (metal negative electrode), and in a more preferred embodiment, a first electrode (positive electrode), a hole transport layer, a photoelectric conversion layer, an electron transport layer, and a second electrode (metal negative electrode), can be formed on the support and retained thereon. For example, the support can be appropriately selected from a glass plate, a plastic film and the like according to the purpose.

Hereinafter, a plastic film substrate as a representative example of the support will be described.

The material, thickness and the like of the plastic film substrate are not particularly limited and can be appropriately selected according to the purpose. In the case of producing an organic thin film solar cell having light transmissibility, a plastic film substrate having excellent transmissibility to light, for example, light having a wavelength in the range of 400 nm to 800 nm, is preferred.

Light transmittance can be calculated by measuring the total light transmittance and the amount of scattered light using the method described in JIS K7105, that is, using an integrating sphere type light transmittance measuring apparatus, and subtracting the diffuse transmittance from the total light transmittance.

As the material of the plastic film that can be used for the support, specific examples include thermoplastic resins, such as polyester resins, methacryl resins, methacrylic acid-maleic anhydride copolymers, polystyrene resins, transparent fluororesins, polyimides, fluoropolyimide resins, polyamide resins, polyamidimide resins, polyetherimide resins, cellulose acylate resins, polyurethane resins, polyether ether ketone resins, polycarbonate resins, alicyclic polyolefin resins, polyarylate resins, polyether sulfone resins, polysulfone resins, cycloolefin copolymers, fluorene ring-modified polycarbonate resins, alicyclic-modified polycarbonate resins, fluorene ring-modified polyester resins, and acryloyl compounds.

It is preferable that the plastic film substrate be formed from a material having heat resistance. Specifically, it is preferable that the plastic film substrate be formed from a material which has heat resistance that satisfies at least any one property of a glass transition temperature (Tg) of 100° C. or more and a linear thermal expansion coefficient of 40 ppm-K$^{-1}$ or less, and also has high transparency to the wavelength of the exposure light as described above.

Meanwhile, the Tg and linear expansion coefficient of a plastic film are measured by the method for measuring the transition temperature of a plastic as described in JIS K7121, and the method for testing the linear expansion coefficient by a thermomechanical analysis for a plastic as described in JIS K7197, and in the present invention, the values measured by this method are used.

Tg and the linear expansion coefficient of the plastic film substrate may be controlled by an additive or the like. Examples of such a thermoplastic resin excellent in heat resistance includes polyethylene naphthalate (PEN: 120° C.), polycarbonate (PC: 140° C.), alicyclicpolyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compounds (compounds described in JP-A 2002-80616: 300° C. or more), and polyimide (the parenthesized data are Tg). These are suitable as the base material according to the present invention. In particular, for high transparency, use of alicyclic polyolefin is preferred.

The plastic film that is used as the support is required to be transparent to light. More specifically, the light transmittance to light having a wavelength in the range of 400 nm to 800 nm is usually preferably 80% or more, more preferably 85% or more, and even more preferably 90% or more.

There are no particular limitations on the thickness of the plastic film, the thickness is typically 1 μm to 800 μm, and preferably 10 μm to 300 μm.

On the back surface side (surface on the side where a positive electrode is not formed) of the plastic film, a functional layer which is publicly known may be provided. Examples thereof include a gas barrier layer, a matting agent layer, a reflection preventive layer, a hard coat layer, an anti-fog layer, and an anti-fouling layer. In addition to these, functional layers are described in detail in paragraphs [0036] to [0038] of JP-A-2006-289627.

(Easily Adhesive Layer/Undercoat Layer)

The front surface (surface on the side where a positive electrode is formed) of the plastic film may have an easily adhesive layer or an undercoat layer from the viewpoint of enhancing adhesiveness. The easily adhesive layer or undercoat layer may be a single layer, or may be a multilayer.

For the formation of the easily adhesive layer or undercoat layer, various hydrophilic primer coating polymers are used. Examples of the hydrophilic primer coating polymers that are used in the present invention include water-soluble polymers such as gelatin, gelatin derivatives, casein, agar, sodium alginate, starch, and polyvinyl alcohol; cellulose esters such as carboxymethyl cellulose and hydroxyethyl cellulose; latex polymers such as vinyl chloride-containing copolymers, vinylidene chloride-containing copolymers, acrylic acid ester-containing copolymers, vinyl acetate-containing copolymers, and butadiene-containing copolymers; polyacrylic acid copolymers, and maleic anhydride copolymers.

The coating film thickness after drying of the easily adhesive layer or undercoat layer is preferably in the range of 50 nm to 2 μm. Also, in the case of using the support as a provisional support, the support surface can be subjected to a treatment for easy detachability.

(Functional Layer)

On the back surface side (surface on the side where a positive electrode is not formed) of the support, a functional layer may be provided. Examples thereof include a gas barrier layer, a matting agent layer, a reflection preventive layer, a hard coat layer, an anti-fog layer, an anti-fouling layer, and an easily adhesive layer. In addition to these, functional layers are described in detail in paragraphs [0036] to [0038] of JP-A-2006-289627, and the functional layers described therein may be provided in accordance with the purpose.

<Recombination Layer>

The solar cell according to the present invention may have a so-called tandem type configuration in which plural photoelectric conversion layers are laminated. The tandem type configuration may be of series connection type or parallel connection type.

In a tandem type element having two photoelectric conversion layers, a recombination layer is provided between the two photoelectric conversion layers. As the material for the recombination layer, an ultrathin film of an electrically conductive material is used. Preferred examples of the conductive material include gold, silver, aluminum, platinum, titanium oxide, and ruthenium oxide. Among these, silver that is relatively inexpensive and stable is preferred. The film thickness of the recombination layer is 0.01 nm to 5 nm, preferably 0.1 nm to 1 nm, and particularly preferably 0.2 nm to 0.6 nm. There are no particular limitations on the method for forming the recombination layer, and the recombination layer can be formed by, for example, a PVD method such as a vacuum deposition method, a sputtering method, or an ion plating method.

<Other Semiconductor Layers>

If necessary, the photovoltaic cell may also include auxiliary layers such as a hole inhibiting layer and an exciton diffusion prevention layer. Meanwhile, in the present invention, the photovoltaic cell may include layers such as a photoelectric conversion layer, a hole transport layer, a hole injection layer, an electron transport layer, an electron injection layer, an electron inhibiting layer, a hole inhibiting layer, and an exciton diffusion prevention layer, which are formed between the first electrode and the second electrode (the positive electrode and the metal negative electrode). The layers which transport electrons or holes will be collectively referred to as "semiconductor layers".

<Protective Layer>

The photovoltaic cell according to the present invention may be coated with a protective layer. Examples of the material that is contained in the protective layer include inorganic materials, including metal oxides such as magnesium oxide, aluminum oxide, silicon oxide (SiOx), titanium oxide, germanium oxide, yttrium oxide, zirconium oxide, and hafnium oxide; metal nitrides such as silicon nitride (SiNx); metal nitride oxides (metal oxynitrides) such as silicon nitride oxide (SiOxNy); metal fluorides such as lithium fluoride, magnesium fluoride, aluminum fluoride, and calcium fluoride; and diamond-like carbon (DLC). Examples of organic materials include polymers such as polyethylene, polypropylene, polyvinylidene fluoride, polyparaxylylene, and polyvinyl alcohol. Among these, oxides, nitrides and nitride oxides of metals, and DLC are preferred, and oxides, nitrides and nitride oxides of silicon and aluminum are particularly preferred. The protective layer may have a configuration of a single layer or a multilayer.

There are no particular limitations on the method for forming the protective layer, and for example, PVD methods such as a vacuum deposition method, a sputtering method, an MBE (molecular beam epitaxy) method, a cluster ion beam method, an ion plating method, and a plasma polymerization method; various CVD methods including an atomic layer deposition method (ALD method or ALE method), coating methods, printing methods, and transfer methods can be applied. In the present invention, the protective layer may be used as a conductive layer.

<Gas Barrier Layer>

A protective layer that is intended to inhibit the penetration of active factors such as water molecules or oxygen molecules is also particularly referred to as a gas barrier layer, and the photovoltaic cell, particularly organic thin film solar cell, according to the present invention preferably has a gas barrier layer. The gas barrier layer is not particularly limited as long as it is a layer which blocks active factors such as water molecules or oxygen molecules, and those materials previously exemplified for the protective layer are usually used. These may be pure materials, or may be mixtures having plural compositions, or graded compositions. Among these, oxides, nitrides, and nitride oxides of silicon and aluminum are preferred.

The gas barrier layer may be a single layer, or may include plural layers. For the gas barrier layer, a laminate of an organic material layer and an inorganic material layer may be used, or an alternating laminate of plural inorganic material layers and plural organic material layers may also be used. The organic material layer is not particularly limited as long as the layer is smooth, but preferred examples include layers formed from polymerization products of (meth)acrylates. Regarding the inorganic material layer, the materials for the protective layer described above are preferred, and oxides, nitrides, and nitride oxides of silicon and aluminum are particularly preferred.

Not specifically defined, the thickness of the inorganic material layer is generally within a range of from 5 to 500 nm per one layer, preferably from 10 to 200 nm per one layer. The inorganic material layer may be a laminate composed of a plurality of sub-layers. In this case, each sub-layer may have the same composition, or a different composition. In addition, as so mentioned hereinabove and as disclosed in US 2004/00046497, the inorganic layers may be gradation layers of which the composition changes continuously in the thickness direction of the layer, with no definite boundary to the adjacent inorganic layer.

The thickness of the photovoltaic cell according to the present invention is not particularly limited. In the case of producing an organic thin film solar cell having light transmissibility, the thickness is preferably 50 μm to 1 mm, and more preferably 100 μm to 500 μm.

When a module for sunlight power generation is produced using the photovoltaic cell according to the present invention, reference can be made to the descriptions in Yoshihiro Hamakawa, "Taiyoko Hatsuden: Saishin no Gijutsu to Shisutemu (Photovoltaic power generation: Latest Technologies and Systems)", CMC Publishing (2000), and the like.

The polymer having a structural unit represented by Formula (I) of the present invention, and the photovoltaic cell have been described, and in some embodiments, the polymer having a structural unit represented by Formula (I) of the present invention can be used in other elements and systems. For example, such a polymer can be used in suitable organic semiconductor elements such as field effect transistors, photodetectors (for example, infrared light detectors), photovoltaic detectors, image pickup elements (for example, RGB image pickup elements of cameras or medical image pickup systems), light emitting diodes (LED) (for example, organic LED's or infrared or near-infrared LED's), laser elements, conversion layers (for example, layers that convert visible light emission to infrared light emission), amplifier radiators for electric communication (for example, doping agent for fibers), memory elements (for example, holographic memory elements), and electrochromic elements (for example, electrochromic displays).

EXAMPLES

The present invention will be described in more detail based on the following examples. The materials, used amounts, proportions, treatments, treatment procedures and the like indicated in the following Examples can be appropriately modified as long as the purport of the present invention is maintained. It is therefore understood that the present invention is by no means intended to be limited to the specific examples below.

Experiment 1

Synthesis of Polymer 1

Synthesis was carried out as shown in Scheme 1 described below.

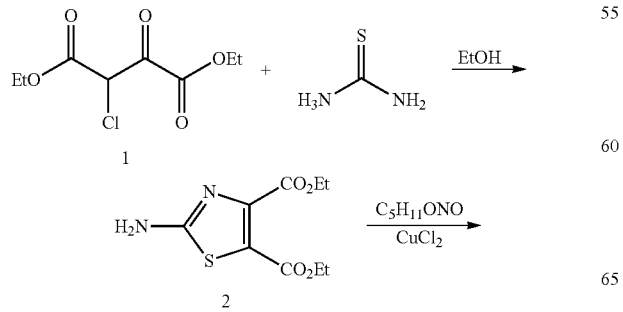

Scheme 1

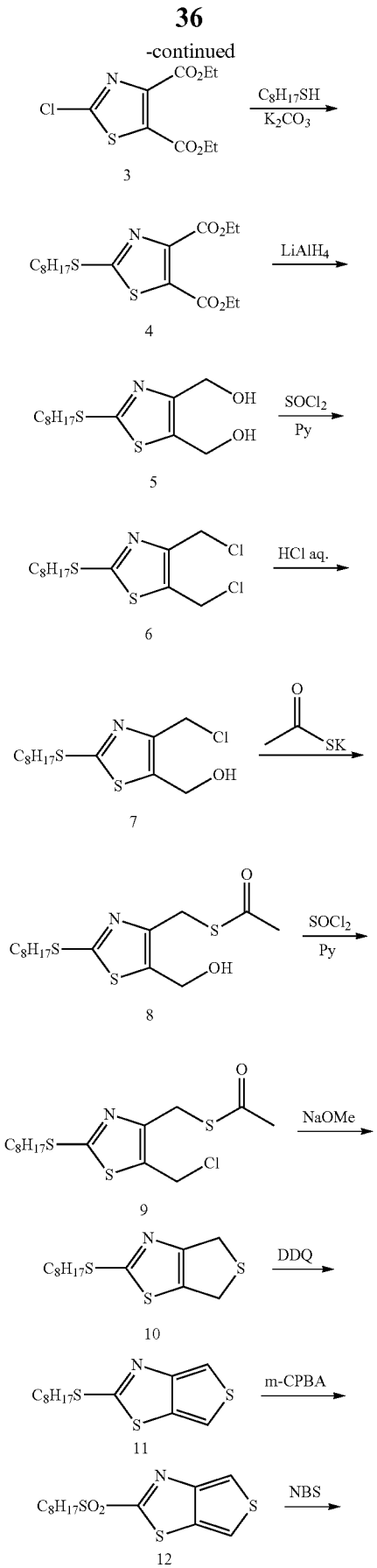

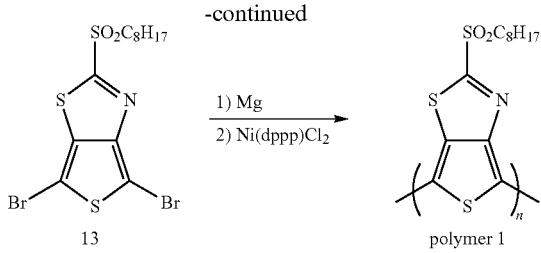

(Synthesis of Intermediate 2)

111.3 g of Compound 1 and 38.1 g of thiourea were added to 250 ml of ethanol, and the mixture was heated to reflux for 2 hours. The reaction liquid was poured into ice water, and a 10% aqueous solution of sodium hydroxide was added thereto until the reaction liquid turned weakly alkaline. The mixture was extracted with ethyl acetate. The extract was washed with a saturated aqueous solution of sodium hydrogen carbonate and saturated brine, and then was dried over anhydrous magnesium sulfate. After filtration, the solvent was distilled off under reduced pressure, and the residue was crystallized from an ethyl acetate/hexane mixed solvent. Thus, 100.2 g of an intermediate 2 was obtained. Yield: 82.0%.

(Synthesis of Intermediate 3)

56.5 g of copper (II) chloride was added to 1 L of acetonitrile, and 44.5 g of isoamyl nitrite was added thereto at room temperature. The temperature was increased to 30° C., and then 92.8 g of the intermediate 2 was added thereto over one hour at 30° C. to 32° C. The temperature was increased to 40° C., and the mixture was allowed to react for 2 hours. Subsequently, the reaction mixture was poured into water, and ethyl acetate was added thereto. The mixture was filtered through Celite, and then the filtrate was subjected to liquid-liquid partition. The organic layer was washed with an aqueous solution of sodium sulfite and saturated brine, and then was dried over anhydrous magnesium sulfate. After filtration, the solvent was distilled under reduced pressure, and the residue was purified by silica gel column chromatography. Thus, 71.8 g of an intermediate 3 was obtained. Yield: 71.7%.

(Synthesis of Intermediate 4)

Under water cooling, 22.1 g of the intermediate 3, 12.3 g of n-octanethiol, and 23.1 g of potassium carbonate were added to 250 ml of acetone, and the mixture was allowed to react for 6 hours at room temperature. The reaction mixture was poured into ice water, and ethyl acetate and 5 ml of an aqueous solution of sodium hypochlorite were added thereto. The mixture was subjected to liquid-liquid partition, and the organic layer was washed with saturated brine, and then was dried over anhydrous magnesium sulfate. After filtration, the solvent was distilled off under reduced pressure, and thus 30.6 g of an intermediate 4 was obtained. Yield: 97.7%.

(Synthesis of Intermediate 5)

4.56 g of lithium aluminum hydride was added to 300 ml of dry THF, and while the mixture was cooled with an ice-acetone coolant, a solution prepared by dissolving 29.9 g of the intermediate 4 in 100 ml of dry THF was added dropwise thereto over 45 minutes at or below 5° C. The mixture was allowed to react for 15 minutes at or below 5° C., and then 50 ml of acetone was added dropwise thereto over 5 minutes at or below 17° C. The mixture was stirred for 10 minutes at room temperature, and then 50 ml of 1 N aqueous hydrochloric acid was added dropwise thereto over 15 minutes under water cooling. The mixture was stirred for 30 minutes at room temperature, and then ethyl acetate and hexane were added thereto. The mixture was filtered through Celite, and then the filtrate was subjected to liquid-liquid partition. The organic layer was washed with water, a saturated aqueous solution of sodium hydrogen carbonate, and saturated brine, and then was dried over anhydrous magnesium sulfate. After filtration, the solvent was distilled off under reduced pressure, and the residue was purified by silica gel column chromatography. Thus, 19.1 g of an intermediate 5 was obtained. Yield: 82.3%.

(Synthesis of Intermediate 6)

17.4 g of the intermediate 5 and 1.5 ml of pyridine were added to 200 ml of toluene, and while the mixture was cooled with an ice-acetone coolant, a solution prepared by dissolving 13.1 ml of thionyl chloride in 100 ml of toluene was added dropwise to the mixture over 25 minutes at or below 4° C. The mixture was allowed to react for one hour at or below 7° C., and then the reaction mixture was poured into ice water. The mixture was extracted with ethyl acetate. The mixture was subjected to liquid-liquid partition, and the organic layer was washed with a saturated aqueous solution of sodium hydrogen carbonate and saturated brine, and then was dried over anhydrous magnesium sulfate. After filtration, the solvent was distilled off under reduced pressure, and thus 18.2 g of an intermediate 6 was obtained. Yield: 92.8%.

(Synthesis of Intermediate 7)

16.3 g of the intermediate 6 and 50 ml of 1 N aqueous hydrochloric acid were added to 200 ml of acetone, and the mixture was heated to reflux for 3 hours. Furthermore, 20 ml of 1 N aqueous hydrochloric acid was added to the mixture, and the resulting mixture was heated to reflux for 5.5 hours. The mixture was extracted with ethyl acetate, and the organic layer was washed with a saturated aqueous solution of sodium hydrogen carbonate and saturated brine, and then was dried over anhydrous magnesium sulfate. After filtration, the solvent was distilled off under reduced pressure, and thus 15.4 g of an intermediate 7 was obtained. Yield: 100%.

(Synthesis of Intermediate 8)

15.1 g of the intermediate 7 and 6.3 g of sodium thioacetate were added to 200 ml of acetone, and the mixture was stirred for one hour at room temperature. The mixture was poured into water, and the mixture was extracted with ethyl acetate. The mixture was subjected to liquid-liquid partition, and the organic layer was washed with a saturated aqueous solution of sodium hydrogen carbonate and saturated brine, and then was dried over anhydrous magnesium sulfate. After filtration, the solvent was distilled off under reduced pressure, and the residue was purified by silica gel column chromatography. Thus, 14.9 g of an intermediate 8 was obtained. Yield: 87.5%.

(Synthesis of Intermediate 9)

13.9 g of the intermediate 8 and 1.0 ml of pyridine were added to 150 ml of toluene, and while the mixture was cooled with an ice-acetone coolant, a solution prepared by dissolving 4.4 ml of thionyl chloride in 50 ml of toluene was added dropwise to the mixture over 30 minutes at or below 5° C. The mixture was allowed to react for one hour at or below 5° C., and then the reaction mixture was poured into ice water. The mixture was extracted with ethyl acetate. The mixture was subjected to liquid-liquid partition, and the organic layer was washed with a saturated aqueous solution of sodium hydrogen carbonate and saturated brine, and then was dried over anhydrous magnesium sulfate. After filtration, the solvent was distilled off under reduced pressure, and thus 14.1 g of an intermediate 9 was obtained. Yield: 96.5%.

(Synthesis of Intermediate 10)

13.2 g of the intermediate 9 was added to 200 ml of acetone, and while the mixture was cooled with an ice-acetone coolant, 7.4 ml of a 28% sodium methoxide methanol solution was added dropwise thereto over 10 minutes at or below 0° C. under nitrogen stream. The mixture was stirred for 30 minutes at or below 5° C., and then was poured into water. The resulting mixture was extracted with ethyl acetate. The resulting mixture was subjected to liquid-liquid partition, and the organic layer was washed with a saturated aqueous solution of sodium hydrogen carbonate and saturated brine, and then was dried over anhydrous magnesium sulfate. After filtration, the solvent was distilled off under reduced pressure, and the residue was purified by silica gel column chromatography. Thus, 8.53 g of an intermediate 10 was obtained. Yield: 82.3%.

(Synthesis of Intermediate 11)

8.04 g of the intermediate 10 was added to 100 ml of toluene, and 6.81 g of DDQ was added thereto over 10 minutes at room temperature. The mixture was heated to reflux for 2 hours, and then was poured into ice water. The mixture was extracted with ethyl acetate. The mixture was subjected to liquid-liquid partition, and the organic layer was washed with an aqueous solution of sodium sulfite, a saturated aqueous solution of sodium hydrogen carbonate, and saturated brine, and then was dried over anhydrous magnesium sulfate. After filtration, the solvent was distilled off under reduced pressure, and the residue was purified by silica gel column chromatography. Thus, 6.56 g of an intermediate 11 was obtained. Yield: 82.2%.

(Synthesis of Intermediate 12)

5.75 g of the intermediate 11 was added to 100 ml of chloroform, and 7.59 g of m-CPBA was added thereto over 30 minutes under ice cooling. The temperature was increased to room temperature, and the mixture was stirred for 3 hours. The mixture was poured into ice water, and was extracted with chloroform. The mixture was subjected to liquid-liquid partition, and the organic layer was washed with an aqueous solution of sodium sulfite, a saturated aqueous solution of sodium hydrogen carbonate, and saturated brine, and then was dried over anhydrous magnesium sulfate. After filtration, the solvent was distilled off under reduced pressure, and the residue was purified by silica gel column chromatography. Thus, 4.87 g of an intermediate 12 was obtained. Yield: 76.7%.

(Synthesis of Intermediate 13)

4.76 g of the intermediate 12 was added to 100 ml of chloroform, and 5.87 g of N-bromosuccinimide was added thereto over 30 minutes under ice cooling. The temperature was increased to room temperature, and the mixture was stirred for one hour. Subsequently, the mixture was poured into ice water, and the resulting mixture was extracted with chloroform. The resulting mixture was subjected to liquid-liquid partition, and the organic layer was washed with a saturated aqueous solution of sodium hydrogen carbonate and saturated brine, and then was dried over anhydrous magnesium sulfate. After filtration, the solvent was distilled off under reduced pressure, and the residue was purified by silica gel column chromatography. Thus, 6.54 g of an intermediate 13 was obtained. Yield: 91.8%.

(Synthesis of Polymer 1)

In a nitrogen atmosphere, 60.0 mg of magnesium fragments were introduced into 50 ml of dry THF, and a solution prepared by dissolving 95.1 mg of the intermediate 13 in 10 ml of dry THF was slowly added dropwise thereto. While the state in which fine foaming from magnesium was sustained was maintained, dropwise addition of the solution of the intermediate 13 was continued. After completion of the dropwise addition, the mixture was further stirred for one hour at 50° C. The mixture was left to cool naturally, and then this solution was taken out with a syringe and was added to a suspension prepared by dispersing 50 mg of (1,3-bis(diphenylphosphino)propane)nickel chloride in 20 ml of dry THF. This mixture was heated to 50° C., and was allowed to react for 10 hours. After the reaction mixture was left to cool naturally, the reaction mixture was poured into 1 N hydrochloric acid, and a precipitate was collected by filtration and washed with water, methanol, and an aqueous solution of ethylenediamine tetraacetate. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 53.3 mg of a polymer 1 was obtained.

The polymer 1 was subjected to an analysis of molecular weight by GPC, and the weight average molecular weight (Mw) calculated relative to standard polystyrenes was 21,000. The dispersity Mw/Mn, which is the ratio of the weight average molecular weight to the number average molecular weight (Mn), was 1.61. Furthermore, the polymer 1 was dissolved in chlorobenzene, and the solution was applied on a glass substrate by spin coating. The absorption spectrum of the coating film was measured, and it was found that λmax was 690 nm.

Experiment 2

Synthesis of Polymer 2

Synthesis was carried out as shown in Scheme 2 described below. An intermediate 14 was synthesized by the same technique as in Experiment 1.

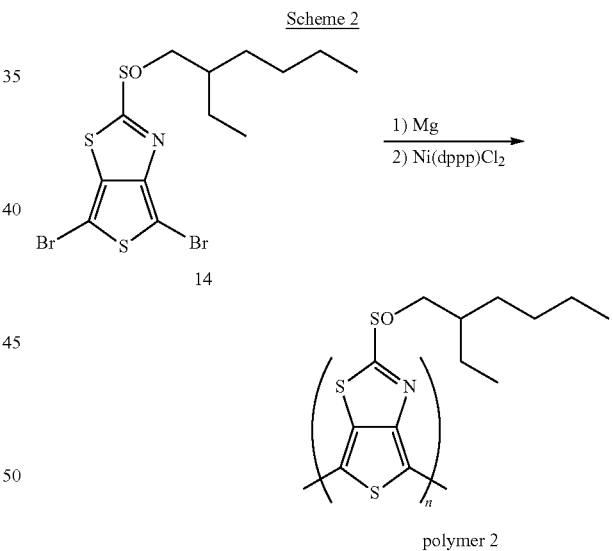

(Synthesis of Polymer 2)

In a nitrogen atmosphere, 60.0 mg of magnesium fragments were introduced into 50 ml of dry THF, and a solution prepared by dissolving 91.9 mg of the intermediate 14 in 10 ml of dry THF was slowly added dropwise thereto. While the state in which fine foaming from magnesium was sustained was maintained, dropwise addition of the solution of the intermediate 14 was continued. After completion of the dropwise addition, the mixture was further stirred for one hour at 50° C. The mixture was left to cool naturally, and then this solution was taken out with a syringe and was added to a suspension prepared by dispersing 50 mg of (1,3-bis(diphenylphosphino)propane)nickel chloride in 20 ml of dry THF.

This mixture was heated to 50° C., and was allowed to react for 10 hours. After the reaction mixture was left to cool naturally, the reaction mixture was poured into 1 N hydrochloric acid, and a precipitate was collected by filtration and washed with water, methanol, and an aqueous solution of ethylenediamine tetraacetate. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 51.6 mg of a polymer 2 was obtained.

The polymer 2 was subjected to an analysis of molecular weight by GPC, and the weight average molecular weight (Mw) calculated relative to standard polystyrenes was 20,500. The dispersity Mw/Mn was 1.48. Similarly, the absorption spectrum of the coating films of the polymer 2 was measured, and it was found that λmax was 650 nm.

Experiment 3

Synthesis of Polymer 3

Synthesis was carried out as shown in Scheme 3 described below. An intermediate 15 was synthesized by the same technique as in Experiment 1.

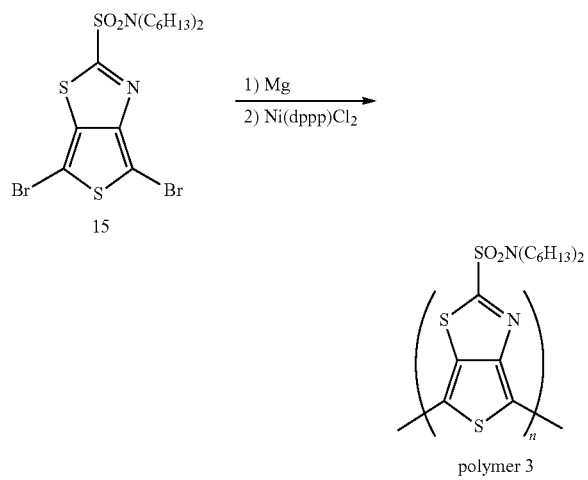

(Synthesis of Polymer 3)

In a nitrogen atmosphere, 60.0 mg of magnesium fragments were introduced into 50 ml of dry THF, and a solution prepared by dissolving 109 mg of the intermediate 15 in 10 ml of dry THF was slowly added dropwise thereto. While the state in which fine foaming from magnesium was sustained was maintained, dropwise addition of the solution of the intermediate 15 was continued. After completion of the dropwise addition, the mixture was further stirred for one hour at 50° C. The mixture was left to cool naturally, and then this solution was taken out with a syringe and was added to a suspension prepared by dispersing 50 mg of (1,3-bis(diphenylphosphino)propane)nickel chloride in 20 ml of dry THF. This mixture was heated to 50° C., and was allowed to react for 10 hours. After the reaction mixture was left to cool naturally, the reaction mixture was poured into 1 N hydrochloric acid, and a precipitate was collected by filtration and washed with water, methanol, and an aqueous solution of ethylenediamine tetraacetate. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 52.1 mg of a polymer 3 was obtained.

The polymer 3 was subjected to an analysis of molecular weight by GPC, and the weight average molecular weight (Mw) calculated relative to standard polystyrenes was 19,600. The dispersity Mw/Mn was 1.41. Similarly, the absorption spectrum of the coating films of the polymer 3 was measured, and it was found that λmax was 660 nm.

Experiment 4

Synthesis of Polymer 4

Synthesis was carried out as shown in Scheme 4 described below. An intermediate 16 was synthesized by the same technique as in Experiment 1.

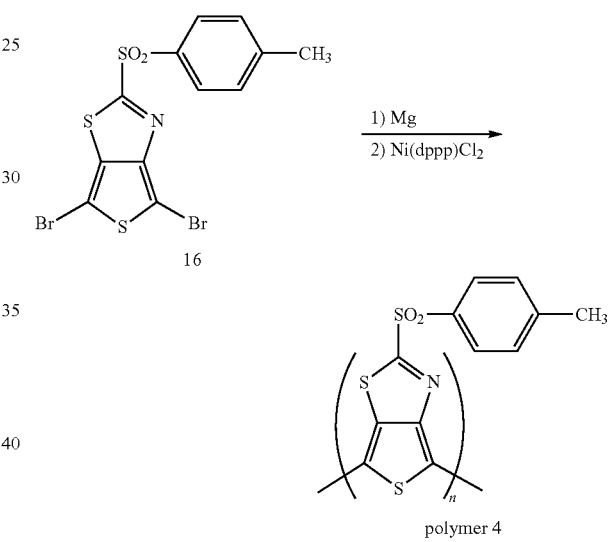

(Synthesis of Polymer 4)

In a nitrogen atmosphere, 60.0 mg of magnesium fragments were introduced into 50 ml of dry THF, and a solution prepared by dissolving 90.6 mg of the intermediate 16 in 10 ml of dry THF was slowly added dropwise thereto. While the state in which fine foaming from magnesium was sustained was maintained, dropwise addition of the solution of the intermediate 16 was continued. After completion of the dropwise addition, the mixture was further stirred for one hour at 50° C. The mixture was left to cool naturally, and then this solution was taken out with a syringe and was added to a suspension prepared by dispersing 50 mg of (1,3-bis(diphenylphosphino)propane)nickel chloride in 20 ml of dry THF. This mixture was heated to 50° C., and was allowed to react for 10 hours. After the reaction mixture was left to cool naturally, the reaction mixture was poured into 1 N hydrochloric acid, and a precipitate was collected by filtration and washed with water, methanol, and an aqueous solution of ethylenediamine tetraacetate. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 50.1 mg of a polymer 4 was obtained.

The polymer 4 was subjected to an analysis of molecular weight by GPC, and the weight average molecular weight (Mw) calculated relative to standard polystyrenes was 17,000. The dispersity Mw/Mn was 1.38. Similarly, the absorption spectrum of the coating films of the polymer 4 was measured, and it was found that λmax was 680 nm.

Experiment 5

Synthesis of Polymer 5

Synthesis was carried out as shown in Scheme 5 described below.

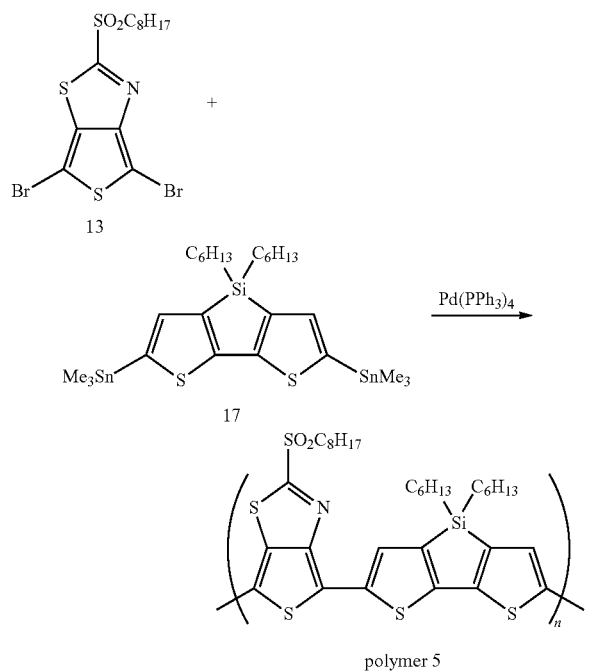

polymer 5

(Synthesis of Polymer 5)

951 mg of the intermediate 13, 1.38 g of an intermediate 17 (a compound described in J. Amer. Chem. Soc., Vol. 130, p. 7670 (2008)), and 100 mg of tetrakis(triphenylphosphine) palladium were introduced into a flask, and a process of evacuating the flask and purging with argon was carried out 3 times. 8 ml of dry DMF and 32 ml of dry toluene were added thereto using syringes, and then the mixture was allowed to react for 12 hours at 120° C. The reaction liquid was added to methanol, and a precipitate was collected by filtration and washed with methanol. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 1.11 g of a polymer 5 was obtained.

The polymer 5 was subjected to an analysis of molecular weight by GPC, and the weight average molecular weight (Mw) calculated relative to standard polystyrenes was 23,000. The dispersity Mw/Mn was 1.53. Similarly, the absorption spectrum of the coating films of the polymer 5 was measured, and it was found that λmax was 660 nm.

Experiment 6

Synthesis of Polymer 6

Synthesis was carried out as shown in Scheme 6 described below.

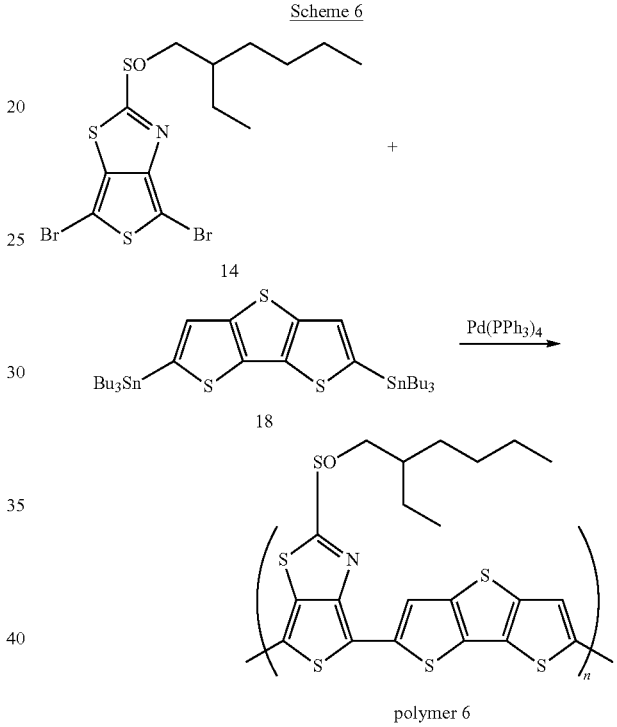

polymer 6

(Synthesis of Polymer 6)

919 mg of the intermediate 14, 1.55 g of an intermediate 18 (a compound described in J. Amer. Chem. Soc., Vol. 130, p. 13433 (2008)), and 100 mg of tetrakis(triphenylphosphine) palladium were introduced into a flask, and a process of evacuating the flask and purging with argon was carried out 3 times. 8 ml of dry DMF and 32 ml of dry toluene were added thereto using syringes, and then the mixture was allowed to react for 12 hours at 120° C. The reaction liquid was added to methanol, and a precipitate was collected by filtration and washed with methanol. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 839 mg of a polymer 6 was obtained.

The polymer 6 was subjected to an analysis of molecular weight by GPC, and the weight average molecular weight (Mw) calculated relative to standard polystyrenes was 17,400. The dispersity Mw/Mn was 1.40. Similarly, the absorption spectrum of the coating films of the polymer 6 was measured, and it was found that λmax was 630 nm.

Experiment 7

Synthesis of Polymer 7

Synthesis was carried out as shown in Scheme 7 described below.

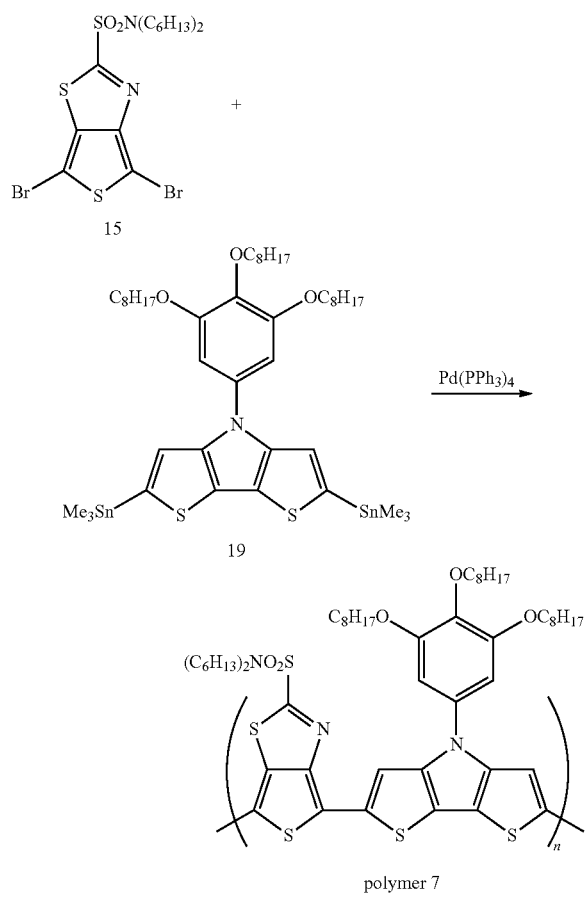

(Synthesis of Polymer 7)

1.09 g of the intermediate 15, 1.93 g of an intermediate 19 (a compound described in Macromolecules, Vol. 41, p. 5582 (2008)), and 100 mg of tetrakis(triphenylphosphine)palladium were introduced into a flask, and a process of evacuating the flask and purging with argon was carried out 3 times. 8 ml of dry DMF and 32 ml of dry toluene were added thereto using syringes, and then the mixture was allowed to react for 12 hours at 120° C. The reaction liquid was added to methanol, and a precipitate was collected by filtration and washed with methanol. This crude product was dissolved in chloroform, and the solution was filtered through Celite. The filtrate was added to hexane, and the mixture was subjected to reprecipitation. A precipitate was collected by filtration, washed with hexane, and then dried in a vacuum. Thus, 1.65 g of a polymer 7 was obtained.

The polymer 7 was subjected to an analysis of molecular weight by GPC, and the weight average molecular weight (Mw) calculated relative to standard polystyrenes was 16,000. The dispersity Mw/Mn was 1.38. Similarly, the absorption spectrum of the coating films of the polymer 7 was measured, and it was found that λmax was 660 nm.

Here, polymer 1 is a polymer having the structural unit of example I-35; polymer 2 is a polymer having the structural unit of example I-1; polymer 3 is a polymer having the structural unit of example I-36; polymer 4 is a polymer having the structural unit of example I-4; polymer 5 is a polymer having the structural unit of example III-11; polymer 6 is a polymer having the structural unit of example III-12; and polymer 7 is a polymer having the structural unit of example III-13.

A comparative polymer 1 as described below was synthesized according to the method described in Polymer Preprints, 44 (1), 1163 (2003).

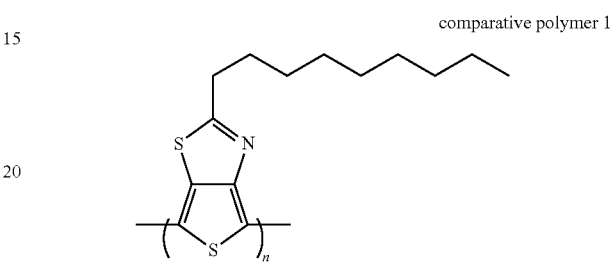

comparative polymer 1

The comparative polymer 1 was subjected to an analysis of molecular weight by GPC, and the weight average molecular weight (Mw) calculated relative to standard polystyrenes was 22,500. The dispersity Mw/Mn was 1.49. Similarly, the absorption spectrum of the coating films of the comparative polymer 1 was measured, and it was found that λmax was 620 nm.

The λmax values in the absorption spectra of the coating films of these various polymers are presented in Table 1 shown below.

(Production of Photovoltaic Cell)

Photovoltaic cells were formed on glass ITO substrates by the following procedure, using polymers 1 to 7 and comparative polymer 1.

On a clean, UV-ozone-treated ITO glass substrate, a PEDOT:PSS (CleviosP VP AI4083 of H.C. Stark GmbH) layer to be used as a hole transport layer was spin-coated and dried for 15 minutes at 120° C.

Subsequently, a mixture (mass ratio 1:1) of one of the p-type semiconductor polymers synthesized as the polymers 1 to 7 and comparative polymer 1, and PC61BM ([60]PCBM manufactured by Solenne BV) was dissolved in o-dichlorobenzene, and then the solution was spin coated on the PEDOT:PSS layer and dried for 15 minutes at 120° C. Thus, a photoelectric conversion layer was formed.

Furthermore, a dehydrated ethanol solution (2 mass %) of titanium isopropoxide (manufactured by Sigma-Aldrich Co.) was spin coated on this photoelectric conversion layer, and the solution was dried for one hour at room temperature. Thus, an electron transport layer of a titanium oxide layer was formed.

Thereafter, an upper electrode was formed by high vacuum deposition of aluminum, and thereby a photovoltaic element was obtained.

At this time, two kinds of elements, namely a 2-mm square element and a 10-mm square element, were produced by changing the size of the glass ITO substrate used, and the pattern size of the ITO and deposited aluminum.

(Evaluation of Photovoltaic Cell)

The 2-mm square element and the 10-mm square element respectively produced as described above were subjected to a performance evaluation as follows.

1) Current Density-Voltage (J-V) Characteristics of Element

For the elements thus obtained, the current density-voltage (J-V) characteristics of the elements were evaluated using a SMU2400 type I-V measuring apparatus manufactured by Keithley Instruments, Inc. in a nitrogen atmosphere (oxygen concentration: 1 ppm or less, moisture concentration: 1 ppm or less). Filtered xenon lamp light from a solar simulator manufactured by Oriel (Oriel) Instruments Corp. was used, and an AM1.5G spectrum of 100 mW/cm$^2$ was approximated. The short circuit current (Jsc), open circuit voltage (Voc), fill factor (FF) and power generation efficiency (η) obtained in the apparatus are presented in the following Table 1.

2) Retention Ratio of Power Generation Efficiency Exposed to Atmosphere

The 2-mm square element obtained as described above was exposed to the light-shielded atmosphere (23° C., 50% RH) for 72 hours, and thereafter, the current density-voltage (J-V) characteristics of the element were evaluated in the same manner as in the above section 1).

These results are presented in the following Table 1.

3) Evaluation of Unevenness for Film Thickness and Pinholes

A PEDOT:PSS layer was spin coated on a clean 100-mm square glass ITO substrate in the same manner as described above, and subsequently, a photoelectric active layer was applied with an automatic coater, then dried over. Unnecessary areas were removed with a cotton swab soaked with ethanol such that there were twenty-five 10-mm square elements at an interval of 10 mm. Thereafter, ten sheets of photovoltaic cell elements each having 25 elements formed therein were produced (250 elements in total) by treating in the same manner as described above.

For each of these elements, the thickness of the photoelectric conversion layer was measured, and the standard deviation of the thickness was determined. Furthermore, the number of pinholes within all of the 250 elements was counted with the naked eye.

These results are summarized in Table 1.

parative Example have low power generation efficiency, have a large decrement in the power generation efficiency after exposure to the atmosphere, have high unevenness for film thickness, and a large number of pinholes.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2011-080813 filed in Japan on Mar. 31, 2011, which is entirely herein incorporated by reference.

The invention claimed is:

1. An organic semiconductor polymer comprising a structural unit represented by the following Formula (I-1):

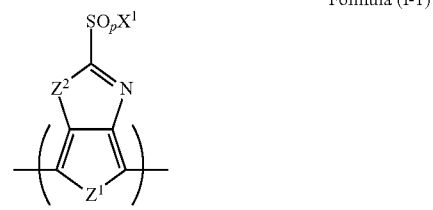

Formula (I-1)

wherein $Z^1$ and $Z^2$ each independently represent S, O, Se or Te; $X^1$ represents an alkyl group, a cycloalkyl group, an aryl group, an aromatic heterocyclic group or —NR$^3$(R$^4$); R$^3$ and R$^4$ each independently represent a hydrogen atom, an alkyl group, a cycloalkyl group, an aryl group or an aromatic heterocyclic group; R$^3$ and R$^4$ may bond with each other to form a ring; and p represents 1 or 2.

2. The organic semiconductor polymer according to claim 1, wherein p is 2 in Formula (I-1).

TABLE 1

| photoelectric conversion layer, polymer examples | 2-mm square element (inicial) | | | | | 2-mm square element (after exposure to the atmosphere) | | 10-mm square element (The result of 250 elements) | | |
|---|---|---|---|---|---|---|---|---|---|---|
| | λmax [nm] | Jsc [mA/cm$^2$] | Voc [V] | FF [%] | η [%] | η [%] | Retention ratio [%] | unevenness for film thickness standard deviation | The number of pinholes [holes] | Remarks |
| polymer 1 | 690 | 11.0 | 0.74 | 50 | 4.1 | 3.7 | 91 | 0.7 | 1 | This invention |
| polymer 2 | 650 | 10.5 | 0.71 | 53 | 4.0 | 3.6 | 91 | 0.9 | 0 | This invention |
| polymer 3 | 660 | 10.0 | 0.73 | 55 | 4.0 | 3.6 | 90 | 1.0 | 2 | This invention |
| polymer 4 | 680 | 9.6 | 0.70 | 54 | 3.6 | 3.2 | 88 | 0.9 | 1 | This invention |
| polymer 5 | 660 | 10.5 | 0.76 | 56 | 4.5 | 3.8 | 85 | 0.9 | 1 | This invention |
| polymer 6 | 630 | 10.3 | 0.74 | 55 | 4.2 | 3.6 | 86 | 1.2 | 3 | This invention |
| polymer 7 | 660 | 11.0 | 0.74 | 55 | 4.5 | 3.8 | 85 | 1.0 | 1 | This invention |
| comparative polymer 1 | 620 | 7.3 | 0.65 | 47 | 2.2 | 1.4 | 63 | 2.1 | 8 | Comparative example |

As is obvious from Table 1, a solar cell elements using the organic semiconductor polymers of the present invention have high power generation efficiency η, have a high retention ratio of the power generation efficiency after exposure to the atmosphere, have less unevenness for film thickness in the photoelectric conversion layer in a 10-mm square element, and have a fewer number of pinholes. On the contrary, an elements using the organic semiconductor polymers of Com- 3. The organic semiconductor polymer according to claim 1, wherein, in Formula (I-1), $X^1$ is an alkyl group, a cycloalkyl group, an aryl group or an aromatic heterocyclic group.

4. The organic semiconductor polymer according to claim 1, wherein —SO$_p$X$^1$ in Formula (I-1) is —SO$_2$NR$^3$(R$^4$), and wherein R$^3$ and R$^4$ have the same meaning as those in Formula (I-1), respectively.

5. The organic semiconductor polymer according to claim 1, wherein p is 1 in Formula (I-1).

6. The organic semiconductor polymer according to claim 1, wherein the organic semiconductor polymer is a copolymer.

7. The organic semiconductor polymer according to claim 1, wherein the organic semiconductor polymer is a copolymer which further comprises a structural unit represented by the following Formula (II):

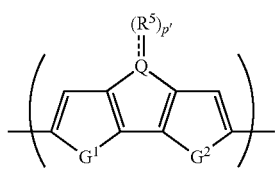

Formula (II)

wherein Q represents Si, S, O or N; $G^1$ and $G^2$ each independently represent S, O, Se or Te; $R^5$ represents a hydrogen atom, an alkyl group, a cycloalkyl group, an aryl group, an aromatic heterocyclic group or an oxygen atom; p' represents 0, 1 or 2; when p' is 2, two $R^5$'s may be the same or different from each other; herein, the bond between Q and $R^5$ is such that when Q is Si or N, the bond is a single bond, and when Q is S, the bond is a double bond; when Q is O, p' represents 0; and when Q is N, p' represents 1.

8. A composition for organic semiconductor material, comprising the organic semiconductor polymer according to claim 1 and an n-type organic semiconductor molecule.

9. The composition for organic semiconductor material according to claim 8, wherein the n-type organic semiconductor molecule is fullerene or a derivative thereof.

10. The composition for organic semiconductor material according to claim 9, wherein the fullerene or a derivative thereof is a phenyl-$C_{61}$-butyric acid ester, a diphenyl-$C_{62}$-bis (butyric acid ester), a phenyl-$C_{71}$-butyric acid ester, a phenyl-$C_{85}$-butyric acid ester, or a thienyl-$C_{61}$-butyric acid ester.

11. A photovoltaic cell comprising the organic semiconductor polymer or the composition for organic semiconductor material according to claim 1.

12. A photovoltaic cell comprising a layer containing the organic semiconductor polymer or the composition for organic semiconductor material according to claim 1, between a first electrode and a second electrode.

13. The photovoltaic cell according to claim 12, comprising a hole transport layer between the first electrode and the layer containing the organic semiconductor polymer or the composition for organic semiconductor material.

14. The photovoltaic cell according to claim 12, comprising an electron transport layer between the second electrode and the layer containing the organic semiconductor polymer or the composition for organic semiconductor material.

15. The photovoltaic cell according to claim 12, wherein the first electrode is a transparent electrode.

16. The photovoltaic cell according to claim 12, wherein the second electrode is a metal electrode.

* * * * *